US012653049B2

(12) United States Patent　　　　　(10) Patent No.:　US 12,653,049 B2

Chiu et al.　　　　　　　　　　　　　(45) Date of Patent:　　Jun. 9, 2026

(54) SEMICONDUCTOR STRUCTURES AND METHOD FOR MANUFACTURING A SEMICONDUCTOR STRUCTURE

(71) Applicant: SERIPHY TECHNOLOGY CORPORATION, Hsinchu County (TW)

(72) Inventors: Tzu-Wei Chiu, Hsinchu County (TW); Chun-Wei Chang, Taipei City (TW); Shang-Pin Chen, Hsinchu County (TW); Wei-Chih Chen, Taoyuan City (TW); Che-Yen Huang, Hsinchu County (TW)

(73) Assignee: SERIPHY TECHNOLOGY CORPORATION, Hsinchu County (TW)

( * ) Notice: Subject to any disclaimer, the term of this patent is extended or adjusted under 35 U.S.C. 154(b) by 582 days.

(21) Appl. No.: 18/171,532

(22) Filed: Feb. 20, 2023

(65) Prior Publication Data

US 2024/0120282 A1　　Apr. 11, 2024

Related U.S. Application Data

(60) Provisional application No. 63/378,697, filed on Oct. 7, 2022.

(51) Int. Cl.
H10W 70/65　　　　(2026.01)
H10B 80/00　　　　(2026.01)
(Continued)

(52) U.S. Cl.
CPC ............ *H10W 70/65* (2026.01); *H10B 80/00* (2023.02); *H10W 20/20* (2026.01); *H10W 70/05* (2026.01); *H10W 70/611* (2026.01);

*H10W 74/014* (2026.01); *H10W 74/117* (2026.01); *H10W 90/00* (2026.01); *H10W 90/701* (2026.01);

(Continued)

(58) Field of Classification Search
CPC ............ H10W 90/794; H10W 90/792; H10W 90/701; H10W 90/297; H10W 90/26; H10W 90/20; H10W 90/00; H10W 80/327; H10W 80/312; H10W 80/00; H10W 74/117; H10W 74/019; H10W 74/014;

(Continued)

(56) References Cited

U.S. PATENT DOCUMENTS 11,869,847　B2 *　1/2024　Lin ...................... H01L 23/5386
2020/0043891　A1 *　2/2020　Yu ........................... H01L 24/92
(Continued)

*Primary Examiner* — Dao H Nguyen

(74) *Attorney, Agent, or Firm* — WPAT, P.C.; Anthony King

(57) ABSTRACT

The present application discloses a semiconductor structure and methods for manufacturing semiconductor structures. The semiconductor structure includes a plurality of bottom dies and a top die stacked on the bottom dies. The bottom dies receive power supplies through tiny through silicon vias (TSVs) formed in backside substrates of the bottom dies, while the top die receives power supplies through dielectric vias (TDVs) formed in a dielectric layer that covers the bottom dies. By enabling backside power delivery to the bottom die, more space can be provided for trace routing between stacked dies. Therefore, greater computation capability can be achieved within a smaller chip area with less power loss.

16 Claims, 34 Drawing Sheets

(51) Int. Cl.

| | |
|---|---|
| *H10W 20/20* | (2026.01) |
| *H10W 70/05* | (2026.01) |
| *H10W 70/60* | (2026.01) |
| *H10W 74/01* | (2026.01) |
| *H10W 74/10* | (2026.01) |
| *H10W 80/00* | (2026.01) |
| *H10W 90/00* | (2026.01) |

(52) U.S. Cl.
CPC ........ *H10W 80/312* (2026.01); *H10W 80/327* (2026.01); *H10W 90/792* (2026.01); *H10W 90/794* (2026.01)

(58) Field of Classification Search
CPC ... H10W 72/90; H10W 72/823; H10W 70/65; H10W 70/614
See application file for complete search history.

(56) References Cited

U.S. PATENT DOCUMENTS

| | | | | |
|---|---|---|---|---|
| 2023/0074181 A1* | 3/2023 | Brun | ........................ | H01L 24/17 |
| 2023/0207475 A1* | 6/2023 | Brun | ................... | H01L 23/5386 |
| | | | | 257/666 |
| 2023/0245976 A1* | 8/2023 | Yu | ........................... | H01L 24/20 |
| | | | | 257/774 |
| 2023/0260977 A1* | 8/2023 | Chen | ........................ | H01L 24/16 |
| | | | | 257/690 |
| 2023/0290746 A1* | 9/2023 | Su | ......................... | H10D 1/716 |

* cited by examiner

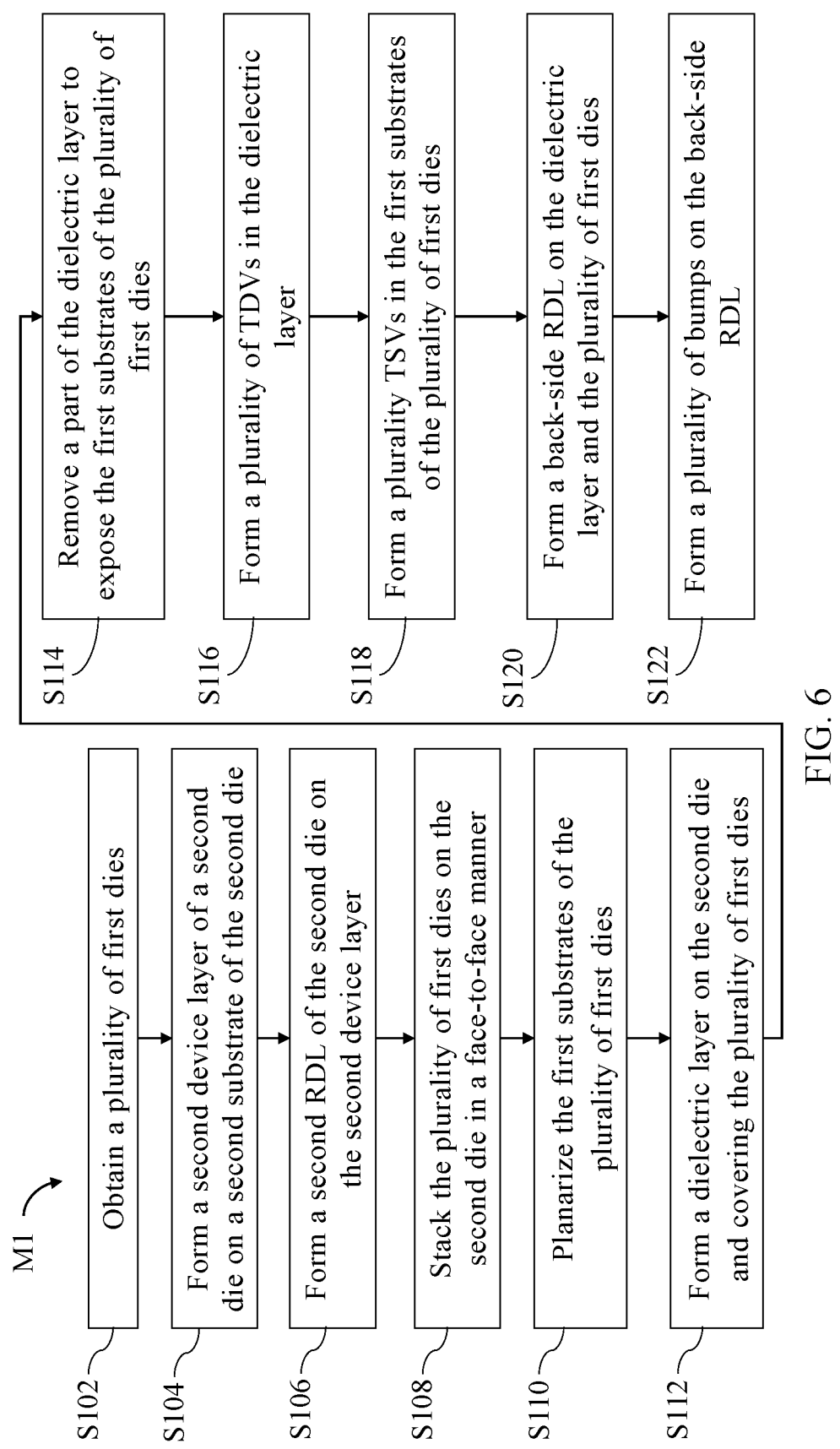

S102 Obtain a plurality of first dies

S104 Form a second device layer of a second die on a second substrate of the second die S106 Form a second RDL of the second die on the second device layer S108 Stack the plurality of first dies on the second die in a face-to-face manner S110 Planarize the first substrates of the plurality of first dies S112 Form a dielectric layer on the second die and covering the plurality of first dies S114 Remove a part of the dielectric layer to expose the first substrates of the plurality of first dies S116 Form a plurality of TDVs in the dielectric layer S118 Form a plurality TSVs in the first substrates of the plurality of first dies S120 Form a back-side RDL on the dielectric layer and the plurality of first dies S122 Form a plurality of bumps on the back-side RDL

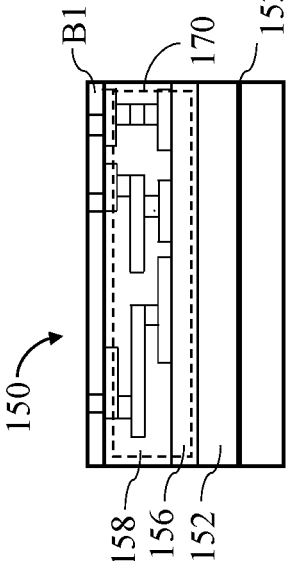
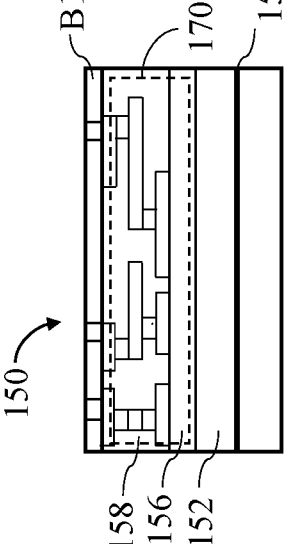
FIG. 7A

S116

S1161 Pattern the dielectric layer to form openings in the dielectric layer by using lithography processes S1162 Sputter or plate a copper layer on the patterned dielectric layer and filling the openings S1163 Polish the copper layer to the stop layers of the plurality of first dies S1164 Remove the stop layers of the plurality of first dies

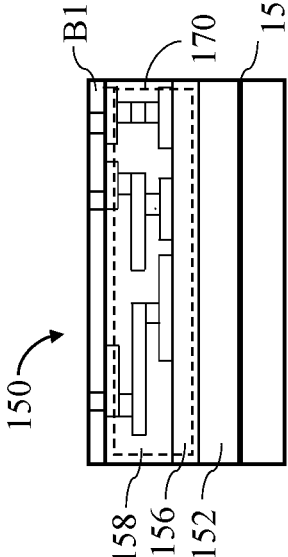
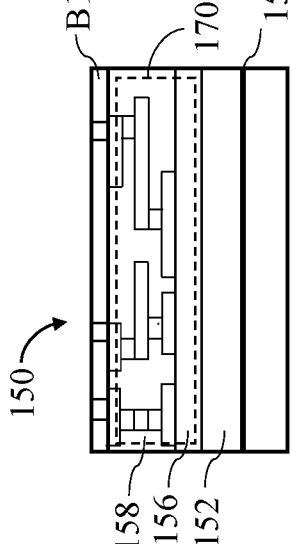
FIG. 11A

SEMICONDUCTOR STRUCTURES AND METHOD FOR MANUFACTURING A SEMICONDUCTOR STRUCTURE

CROSS REFERENCE

This application claims the benefit of prior-filed U.S. provisional application No. 63/378,697, filed on Oct. 7, 2022, which is incorporated by reference in its entirety.

TECHNICAL FIELD

The present disclosure relates to a semiconductor structure, and more particularly, to a semiconductor structure having a die-stacking structure.

DISCUSSION OF THE BACKGROUND

To gain greater computation capability in a smaller area with lower power consumption, a die-stacking technology has been developed and adopted in semiconductor packaging processes. However, routing of traces between dies and external pads has become complicated since the traces need to be arranged densely within a limited area when the dies are stacked. Furthermore, to protect data signals and/or control signals from interference by power signals, certain rules must be followed when routing the traces, which makes the trace routing even more difficult. Therefore, providing a semiconductor structure that can facilitate the trace routing has become an issue to be solved.

SUMMARY

One embodiment of the present disclosure discloses a semiconductor structure. The semiconductor structure includes a backside redistribution layer (RDL), a plurality of bumps, a dielectric layer, a plurality of through dielectric vias (TDVs), a plurality of first dies, and a second die. The plurality of bumps are disposed on a first surface of the backside RDL, and the dielectric layer is disposed on a second surface of the backside RDL. The plurality of TDVs pass through the dielectric layer. The plurality of first dies are disposed within the dielectric layer, and each of the plurality of first dies includes a first substrate, a plurality of through silicon vias (TSVs), a first device layer and a first RDL. The first substrate is disposed on the backside RDL, and the plurality of TSVs pass through the first substrate and contact conductive paths in the backside RDL. The first device layer is disposed on the first substrate, and the first RDL is disposed on the first device layer. The second die is stacked on the plurality of first dies in a face-to-face manner, and the second die includes a second substrate, a second device layer, and a second RDL. The second device layer is disposed on the second substrate, and the second RDL is disposed on the second device layer. The second RDL is coupled to the first RDL and the plurality of TDVs. Each of the plurality of first dies receives a first supply voltage through at least one first bump of the plurality of bumps, at least one first conductive path in the backside RDL, and at least one TSV of the plurality of TSVs. The second die receives a second supply voltage through at least one second bump of the plurality of bumps, at least one second conductive path in the backside RDL, and at least one TDV of the plurality of TDVs.

Another embodiment of the present disclosure discloses a method for manufacturing a semiconductor structure. The method includes obtaining a plurality of first dies, wherein each of the plurality of first dies comprises a first substrate, a first device layer disposed on the first substrate, and a first redistribution layer (RDL) disposed on the first device layer; forming a second device layer of a second die on a second substrate of the second die; forming a second RDL of the second die on the second device layer; stacking the plurality of first dies on the second die in a face-to-face manner; planarizing first substrates of the plurality of first dies; forming a dielectric layer on the second die, wherein the dielectric layer covers the plurality of first dies; removing a part of the dielectric layer to expose the first substrates of the plurality of first dies; forming a plurality of TDVs in the dielectric layer; forming a plurality of TSVs in the first substrates of the plurality of first dies; forming a backside RDL on the dielectric layer and the plurality of first dies, wherein the backside RDL is coupled to the plurality of TDVs and the plurality of TSVs; and forming a plurality of bumps on the backside RDL.

Another embodiment of the present disclosure discloses a method for manufacturing a semiconductor structure. The method includes obtaining a plurality of first dies, wherein each of the plurality of first dies comprises a first substrate, a first device layer disposed on the first substrate, and a first redistribution layer (RDL) disposed on the first device layer; forming a second device layer of a second die on a second substrate of the second die; forming a second RDL of the second die on the second device layer; forming a plurality of copper pillars on the second RDL; stacking the plurality of first dies on the second die in a face-to-face manner; planarizing first substrates of the plurality of first dies; forming a dielectric layer on the second die, wherein the dielectric layer covers the plurality of first dies and the plurality of copper pillars; removing a part of the dielectric layer to expose the first substrates of the plurality of first dies and the plurality of copper pillars; forming a plurality of through silicon vias (TSVs) in the first substrates of the plurality of first dies; forming a backside RDL on the dielectric layer and the plurality of first dies, wherein the backside RDL is coupled to a plurality of TDVs formed by the plurality of copper pillars and the plurality of TSVs; and forming a plurality of bumps on the backside RDL.

Since the semiconductor structure and the methods for manufacturing the semiconductor structure allow backside power delivery in die-stacking structures, more space can be provided for trace routing between stacked dies. As a result, greater computation power can be achieved within a smaller chip area with less power loss.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIG. 6 shows a flowchart of a method for manufacturing a semiconductor structure according to one embodiment of the present disclosure.

FIGS. 7A to 7K are schematic, cross-sectional diagrams showing a manufacturing process according to steps of the method in FIG. 6.

FIGS. 11A to 11K are schematic, cross-sectional diagrams showing a manufacturing process according to steps of the method in FIG. 10.

DETAILED DESCRIPTION

The following description accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described in detail below. However, in addition to the detailed description, the present disclosure may also be widely implemented in other embodiments. The scope of the present disclosure is not limited to the detailed description, and is defined by the claims.

Figure 1:
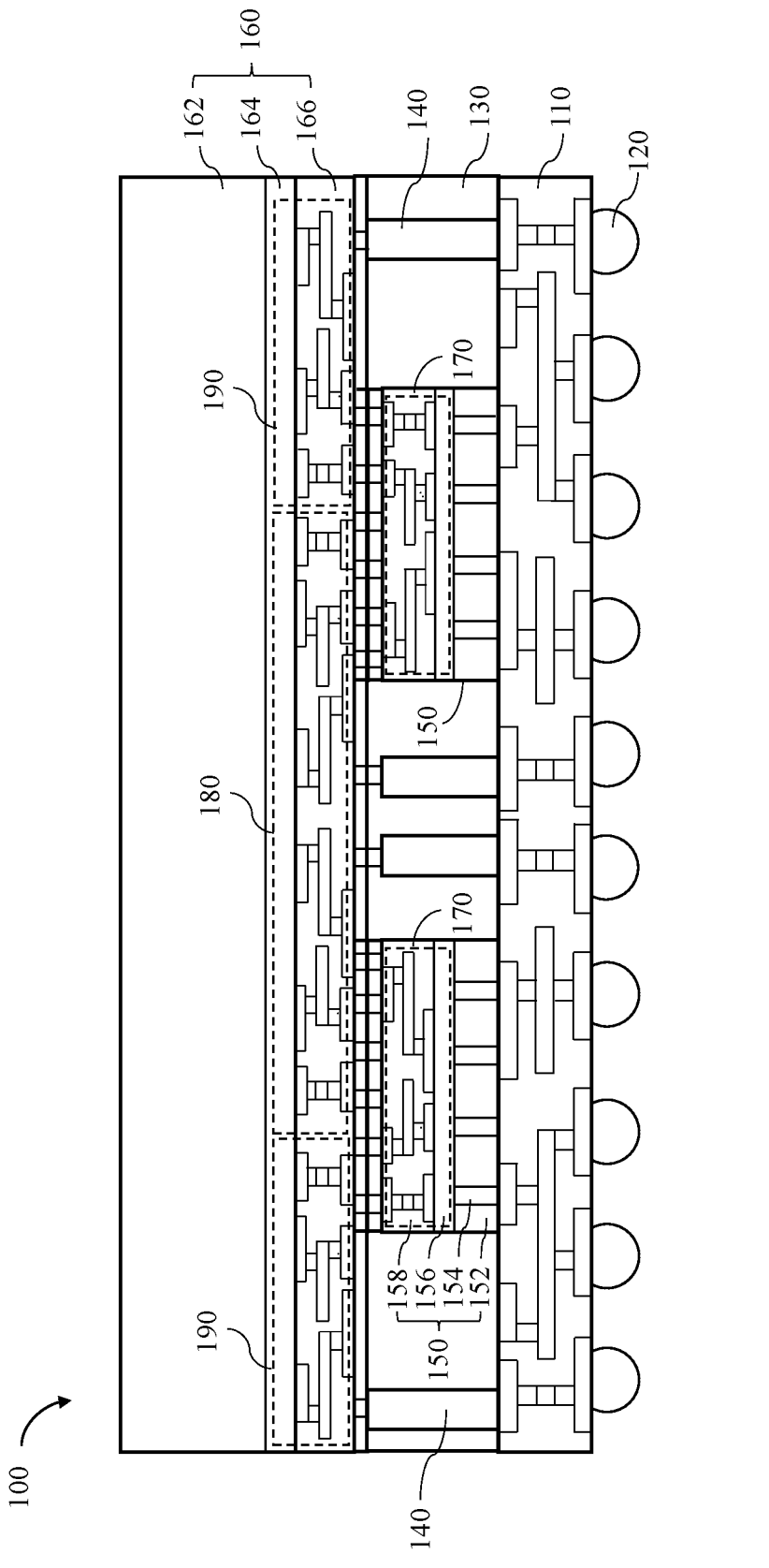
FIG. 1 shows a semiconductor structure according to one embodiment of the present disclosure.

FIG. 1 shows a semiconductor structure 100 according to one embodiment of the present disclosure. The semiconductor structure 100 includes a backside redistribution layer (RDL) 110, a plurality of bumps 120, a dielectric layer 130, a plurality of through dielectric vias (TDVs) 140, a plurality of first dies 150, and a second die 160.

As shown in FIG. 1, the bumps 120 can be disposed on a first surface of the backside RDL 110 for external connections, and the dielectric layer 130 can be disposed on a second surface of the backside RDL 110. Furthermore, the TDVs 140 can pass through the dielectric layer 130, and the TDVs 140 and the first dies 150 can be disposed within the dielectric layer 130 without overlapping or contacting each other. Also, the second die 160 can be stacked on the first dies 150.

In the present embodiment, the semiconductor structure 100 allows backside power deliveries for the first dies 150. For example, the first dies 150 can receive supply voltages through TSVs 154 formed in backside substrates 152 of the first dies 150. Also, the second die 160 may receive supply voltages through the TDVs 140 formed in the dielectric layer 130. In such case, power supply paths for the second die 160 don't need to pass through the first dies 150. Therefore, the region where the first dies 150 overlaps the second die 160 from a top view is unnecessary to accommodate power supply paths of the second die 160. In other words, the overlap region of the first dies 150 and the second die 160 can be more efficiently used for the transmission lines of control signals and/or data signals, thereby allowing better flexibility of trace routing.

In the present embodiment, the first dies 150 can be chiplet core dies, which include computation circuits 170, while the second die 160 can be a memory die, which includes a memory circuit 180. The memory circuit 180 can, for example, be a cache memory of the computation circuits 170. The memory circuit 180 may be a static random-access memory (SRAM), resistive random-access memory (RRAM), magnetoresistive random-access memory (MRAM) and/or another type of memory. In such case, the computation circuits 170 in the first dies 150 can access the memory circuit 180 of the second die 160 through vertical transmission between dies, thereby allowing fast data sharing among different cores. However, the present disclosure is not limited thereto. In some other embodiments, the first dies 150 and the second die 160 may include other types of circuits according to different design needs.

For example, as shown in FIG. 1, the second die 160 can further include a plurality of input/output circuits 190 of the computation circuits 170. In the present embodiment, each of the input/output circuits 190 can be coupled to a corresponding computation circuit 170 in a first die 150. In such case, the input/output circuits 190 can convert digital signals generated by the computation circuits 170 into analog signals so as to transmit the analog signals externally through the bumps 120. Also, the input/output circuits 190 can convert analog signals received externally into digital signals and transmit the digital signals to corresponding computation circuits 170 for processing.

Furthermore, in the present embodiment, die sizes of the first dies 150 can be smaller than a die size of the second die 160. Generally, since configurations inside the first dies 150 can be rather complicated, manufacturing the first dies 150 with smaller die sizes can be beneficial in terms of increasing yield rates. However, in the memory circuit 180, since defective cells can be easily replaced with other good cells as needed, the yield rate of the second die 160 is usually not an issue. Therefore, the second die 160 can be manufactured with a greater die size to increase memory capacity. Furthermore, since the semiconductor structure 100 allows fast signal transmission with the traces formed between the first dies 150 and the second die 160, it is feasible to form the input/output circuits 190 of the computation circuits 170 in the second die 160, and allows the computation circuits 170 to communicate with the input/output circuits 190 through the vertical traces formed between the first dies 150 and the second die 160. As a result, the die size of the first dies 150 can be further reduced, and the yield rate of the first dies 150 can be further improved.

As shown in FIG. 1, each of the first dies 150 includes the substrate 152, a plurality of the through silicon vias (TSVs) 154, a device layer 156, and an RDL 158. The substrate 152 can be disposed on the backside RDL 110, and the TSVs 154 can be formed in the substrate 152 and can pass through the substrate 152 for contacting conductive paths in the backside RDL 110. In addition, the device layer 156 can be disposed on the substrate 152, and the RDL 158 can be disposed on the device layer 156. In the present embodiment, the computation circuits 170 can be formed in the device layers 156 and the RDLs 158 of the first dies 150.

The second die 160 can be stacked on the first dies 150. The second die 160 includes a substrate 162, a device layer 164 disposed on the substrate 162, and an RDL 166 disposed on the device layer 164. In the present embodiment, the memory circuit 180 and the input/output circuits 190 can be formed in the device layer 164 and the RDL 166 of the second die 160. Furthermore, the RDL 166 of the second die 160 can be coupled to the RDLs 158 of the first dies 150 and the TDVs 140. That is, the second die 160 can be stacked on the first die 150 in a face-to-face manner. In some embodiments, the RDL 166 of the second die 160 can be coupled to the RDL 158 of the first dies 150 using hybrid bonding. In such case, the data signals and/or the control signals can be transmitted between the computation circuit 170 and the memory circuit 180 through vertical paths provided by the RDLs 158 and 166 and hybrid bonds between the RDLs 158 and 166. In a conventional 2.5D package, multiple dies may be disposed on a package substrate side-by-side, and the signal transmission among different dies must pass through the traces provided by the packaging substrate to Comparing to such conventional structure, the stacking structure of the semiconductor structure 100 can shorten the signal transmission paths between dies, thereby increasing memory access speed.

Figure 2:
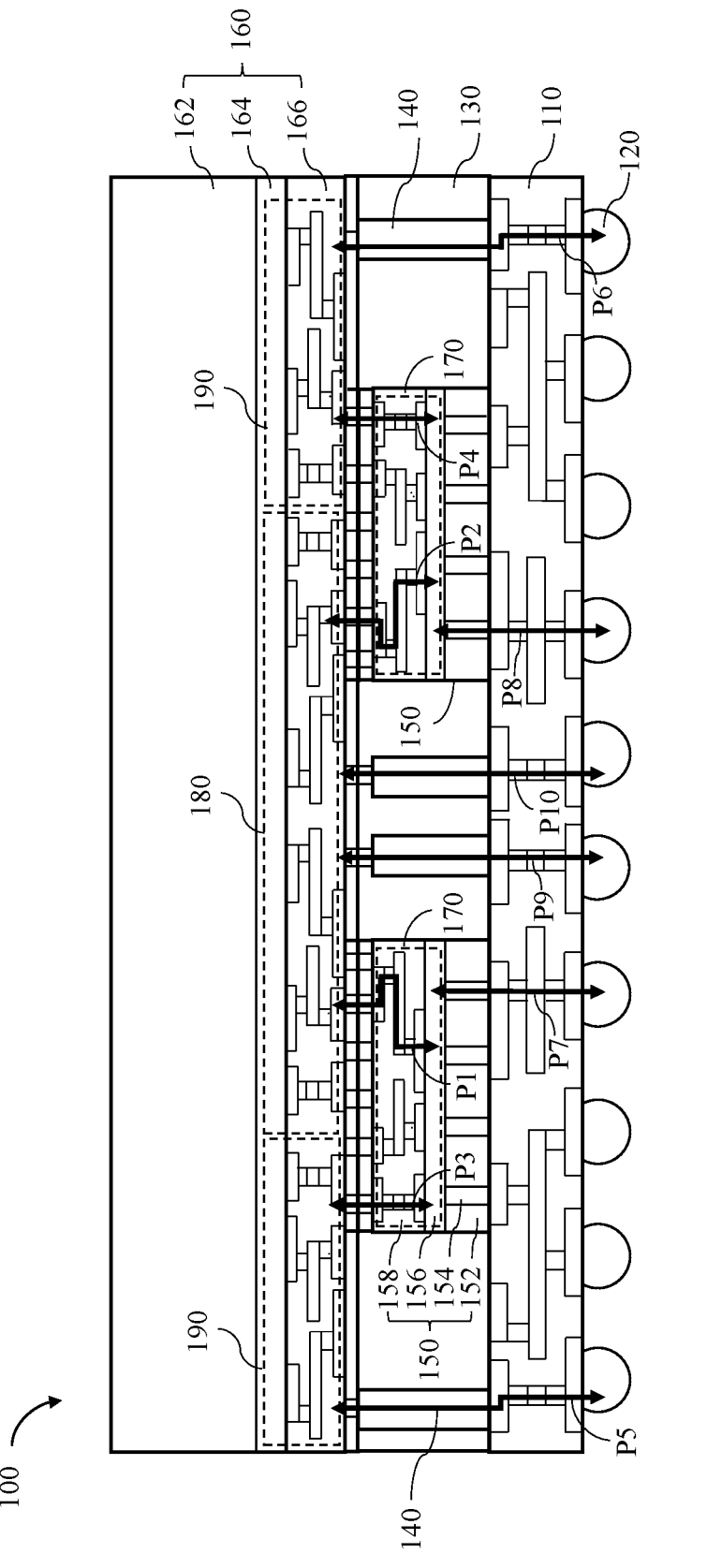
FIG. 2 shows signal transmission paths of the semiconductor structure in FIG. 1 according to one embodiment of the present disclosure.

FIG. 2 shows signal transmission paths of the semiconductor structure 100 according to one embodiment of the present disclosure. In the present embodiment, the computation circuits 170 can transmit signals to and receive signals from the memory circuit 180 through the RDLs 158 and 166, such as along paths P1 and P2 shown in FIG. 2. In addition, the computation circuit 170 can transmit signals to and receive signals from the input/output circuit 190 through the RDL 158 of the first die 150 and the RDL 166 of the second die 160, such as along paths P3 and P4. The input/output circuits 190 can transmit signals to and receive signals from external sources through the bumps 120 and the TDVs 140, such as along paths P5 and P6 shown in FIG. 2.

Furthermore, in the present embodiment, the first dies 150 may include power terminals, and the power terminals can receive supply voltages through the bumps 120, the conductive paths in the backside RDL 110, and the TSVs 154, for example, paths P7 and P8 shown in FIG. 2. In some embodiments, the power terminals may be coupled to power rails disposed in the device layer 156 and/or the RDL 158, and transistors formed in the device layer 156 can be coupled to the power rails so as to receive the supply voltage. In such case, since power can be delivered from the backside of the first dies 150 to the device layers 156, power delivery paths can be shortened, and power loss caused during transmission can be reduced.

In addition, the second die 160 may include power terminals that can receive supply voltages through the bumps 120, the conductive paths in the backside RDL, and the TDVs 140, for example, paths P9 and P10 shown in FIG. 2. As a result, the power signal paths can be separated from the data and/or control signal paths, thereby leaving more room for transmission lines of the control signals and the data signals between the first dies 150 and the second die 160 for routing.

Figure 3:
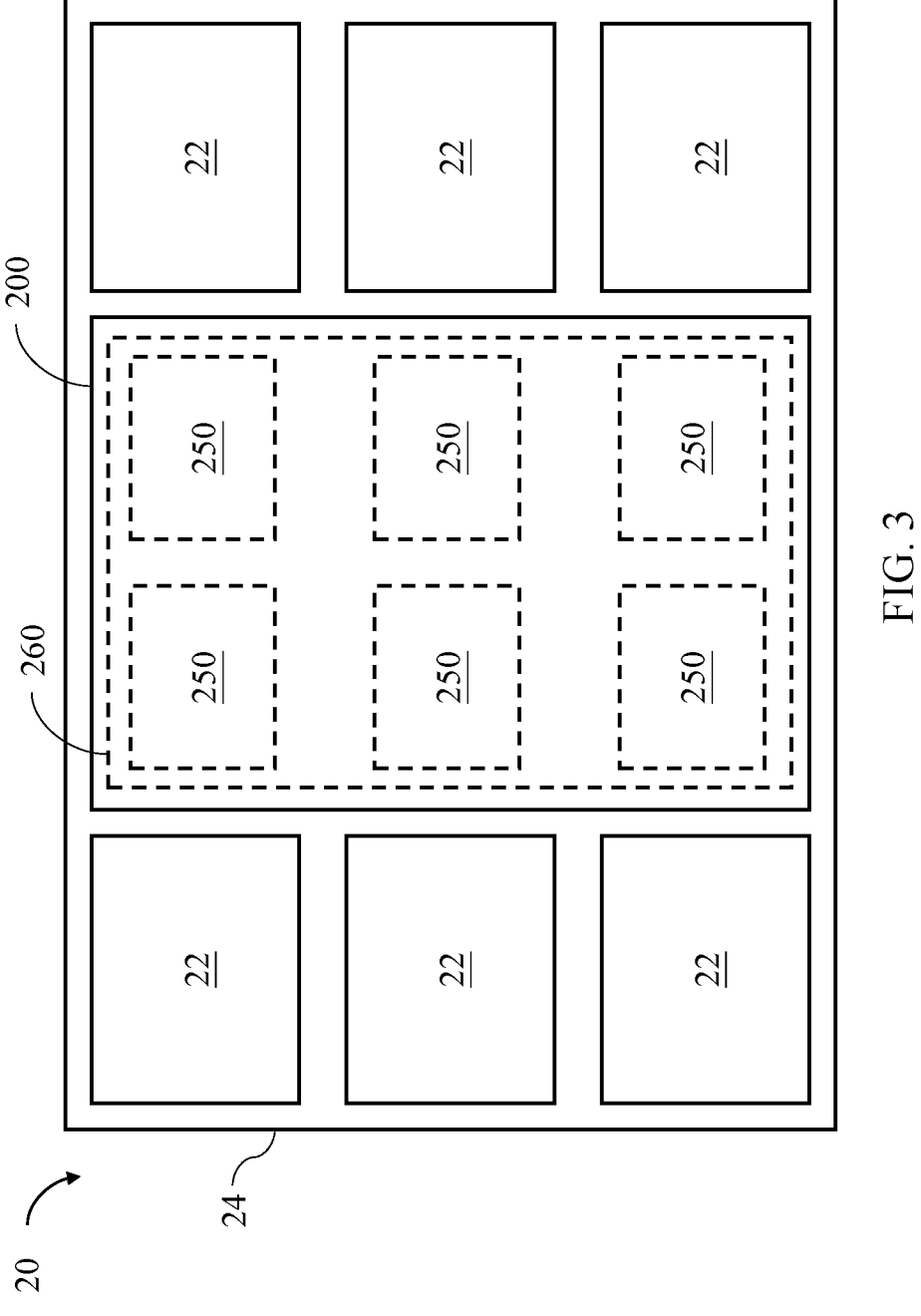
FIG. 3 shows a floorplan of a semiconductor chiplet from a top view according to one embodiment of the present disclosure.

In some embodiments, the semiconductor structure 100 can be deemed as a system on chip (SoC) and can be packaged with high bandwidth memories (HBMs) as a semiconductor chiplet to provide a more complete solution within a smaller size, as shown in FIG. 3.

FIG. 3 shows a floorplan of a semiconductor chiplet 20 according to a first embodiment of the present disclosure. The semiconductor chiplet 20 includes a semiconductor structure 200, HBMs 22, and an interposer 24. In some embodiments, the semiconductor structure 200 and the semiconductor structure 100 may have similar stacking structures. The semiconductor structure 200 and the HBMs 22 can be disposed on the interposer 24, and can be coupled correspondingly through conductive paths provided by the interposer 24. In some embodiments, the interposer 24 may further be disposed on a package substrate. That is, the semiconductor chiplet 20 can be packaged by the chip-on-wafer-on-substrate (CoWos) technique.

In the present embodiment, the semiconductor structure 200 includes six first dies 250 and a second die 260. In addition, each of the six HBMs 22 can be coupled to a computation circuit of a corresponding first die 250 of the six first dies. However, the present disclosure is not limited thereto. In some embodiments, the semiconductor structure 200 may include a greater or smaller number of first dies 250. Furthermore, in some embodiments, the semiconductor chiplet 20 may include more semiconductor structures 200 if a size of the interposer 24 is sufficient.

Figure 4:
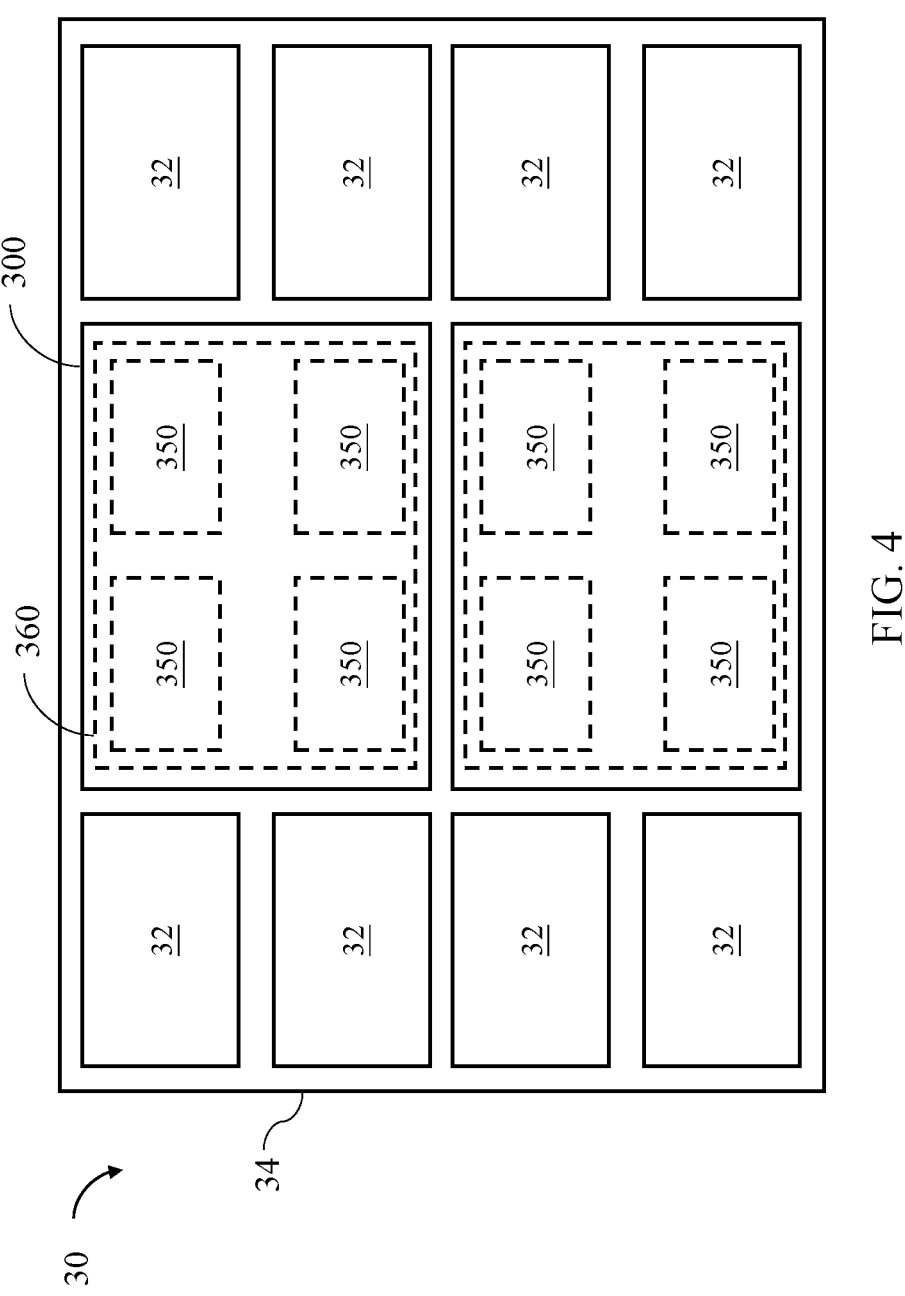
FIG. 4 shows a floorplan of a semiconductor chiplet from a top view according to another embodiment of the present disclosure.

FIG. 4 shows a floorplan of a semiconductor chiplet 30 according to a second embodiment of the present disclosure. The semiconductor chiplet 30 and the semiconductor chiplet 20 have similar structures. However, the semiconductor chiplet includes two semiconductor structures 300, eight HBMs 32, and an interposer 34. The semiconductor structures 300 and the semiconductor structure 100 may have similar die-stacking structures. In addition, the semiconductor structure 300 and the HBMs 32 can be disposed on the interposer 34, and can be coupled correspondingly through conductive paths provided by the interposer 34. In some embodiments, the interposer 34 may further be disposed on a package substrate. That is, the semiconductor chiplet 30 can be packaged by the chip-on-wafer-on-substrate (CoWos) technique. Furthermore, while the semiconductor structure 200 includes six first dies 250 and one second die 260, each of the semiconductor structures 300 includes four first dies 350 and one second die 360.

In some embodiments, while the computation circuits are formed in the first dies 350 (or 250), the physical interface circuits (PHY) of the computation circuits for interfacing with the HBMs 32 (or 22) can be disposed in the second die 360 (or 260). Similarly, serializer/deserializers (SerDes) for serial high-speed analog data transmission and reception can also be disposed in the second die 360 (or 260), thereby reducing die sizes of the first dies 350 (or 250). In such case, the computation circuits in the first dies 350 (or 250) can be coupled to the physical interface circuits and the serializer/deserializers through RDLs of the first dies 350 (or 250) and the second die 360 (or 260) and hybrid bonds between the RDLs.

Figure 5:
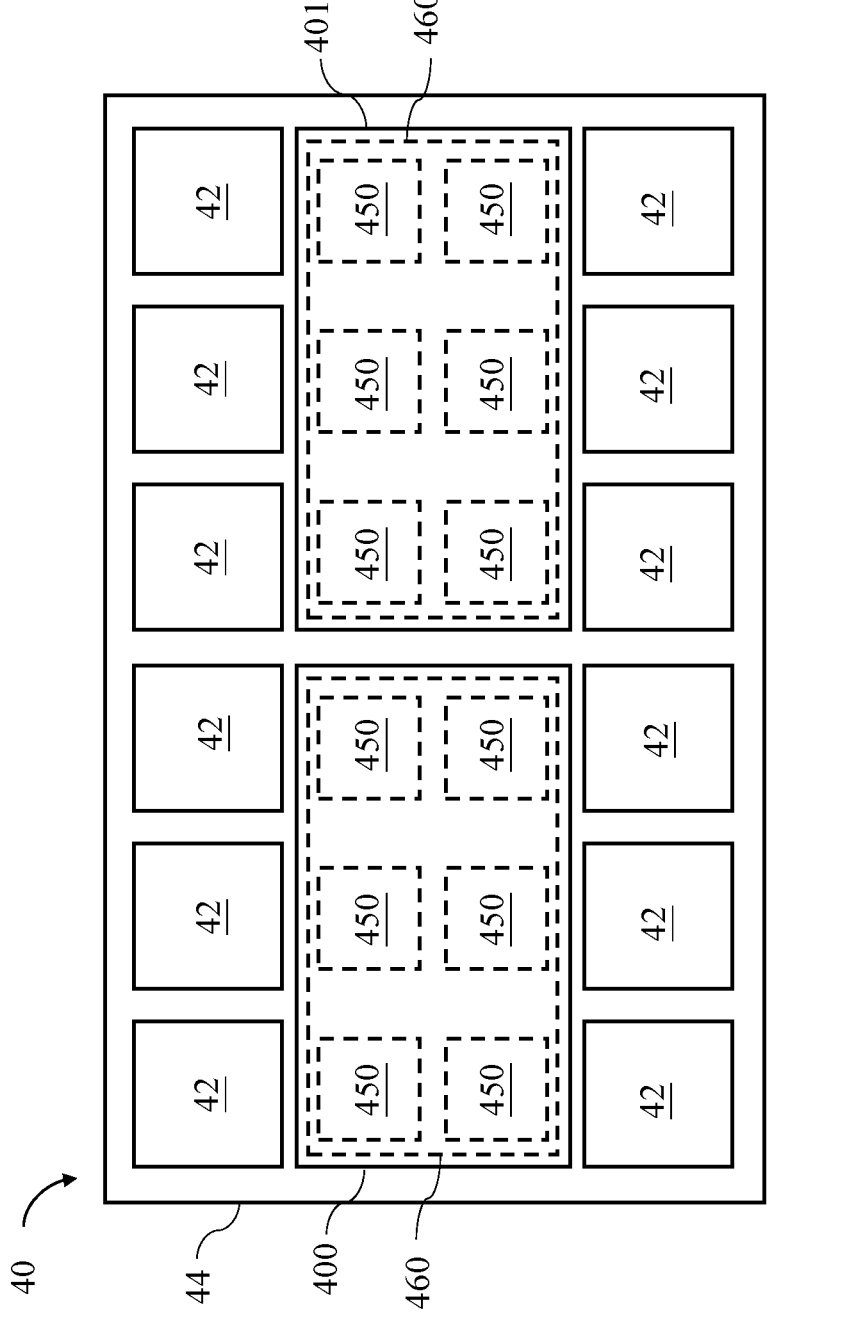
FIG. 5 shows a floorplan of a semiconductor chiplet from a top view according to another embodiment of the present disclosure.

FIG. 5 shows a floorplan of a semiconductor chiplet 40 according to a second embodiment of the present disclosure. The semiconductor chiplet 40 and the semiconductor chiplet 30 have similar structures. However, the semiconductor chiplet 40 includes two semiconductor structures 400 and 401, twelve HBMs 42, and an interposer 44. The semiconductor structures 400, 401 and the semiconductor structure 300 may have similar die-stacking structures. However, each of the semiconductor structures 400 and 401 includes six first dies 450 and one second die 460. In addition, the semiconductor structure 400 and the HBMs 42 can be disposed on the interposer 44, and can be coupled correspondingly through conductive paths provided by the interposer 44. In some embodiments, the interposer 44 may further be disposed on a package substrate. That is, the semiconductor chiplet 40 can be packaged by the chip-on-wafer-on-substrate (CoWos) technique. Furthermore, in some embodiments, the interposer 24 may have an area about two times an area of a regular unit interposer, the interposer 34 may have an area about three times the area of the regular unit interposer, and the interposer 44 may have an area about four times the area of the regular unit interposer. For example, the interposer 24 may have a size about 1700 mm², the interposer 34 may have a size about 2500 mm², and the interposer 44 may have a size of 3300 mm².

FIG. 6 shows a flowchart of a method M1 for manufacturing the semiconductor structure 100 of FIG. 1 according to a first embodiment of the present disclosure. The method M1 includes steps S102 to S122, and can be adopted to manufacture the semiconductor structure 100. FIGS. 7A to 7K are schematic, cross-sectional diagrams showing a manufacturing process according to steps S102 to S122 of the method M1.

In step S102, first dies 150 are obtained, wherein each of the first dies 150 includes a substrate 152, a device layer 156 disposed on the substrate 152, and an RDL 158 disposed on the device layer 156 as shown in FIG. 7A. In the present embodiment, the first dies 150 may further include bonding layers B1 formed on the RDLs 158. In addition, the first dies 150 can be diced from a wafer and can be stacked on a second die 160 in subsequent steps.

Figure 7B:
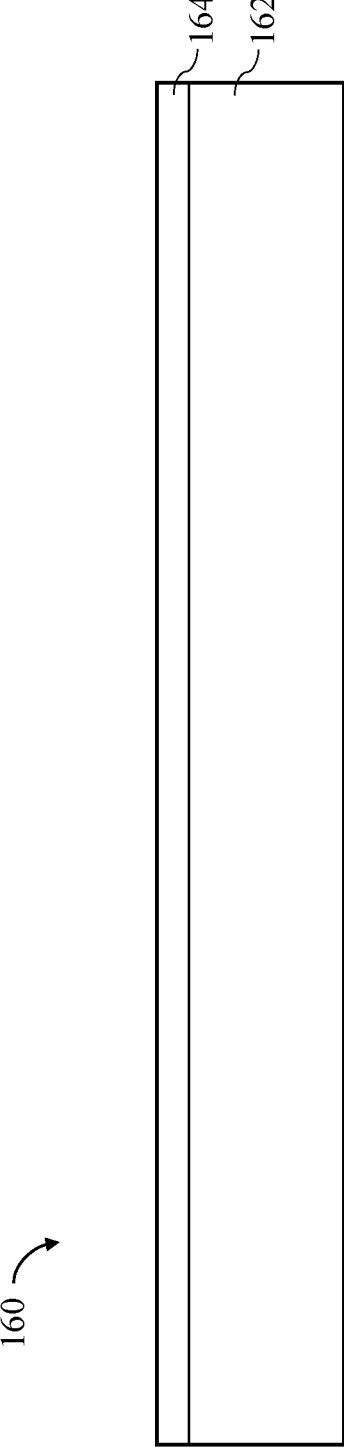
Figure 7C:
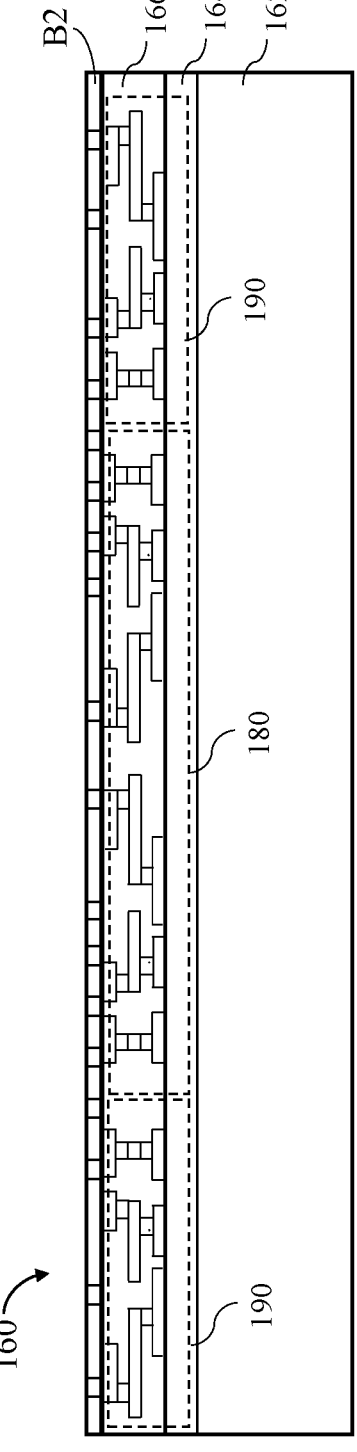
Figure 7D:
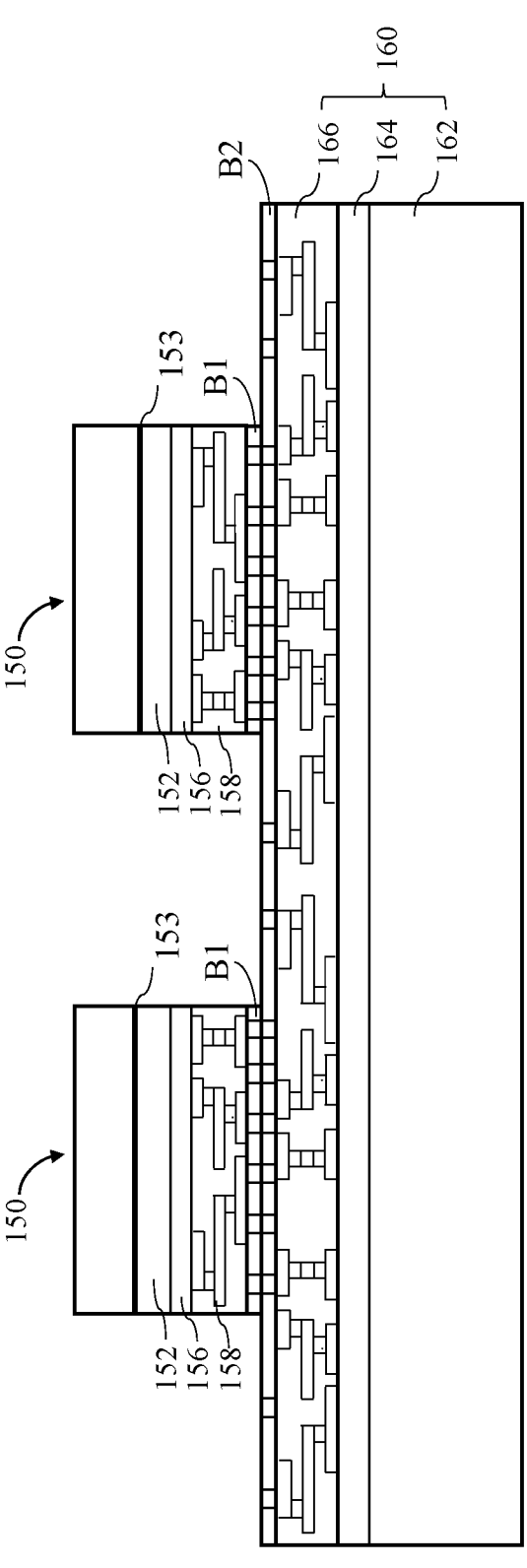

In steps S104 and S106, a device layer 164 and an RDL 166 of the second die 160 are formed sequentially as shown in FIGS. 7B and 7C. In addition, in the present embodiment, a bonding layer B2 of the second die 160 is further formed on the RDL 166. After the RDL 166 and the bonding layer B2 are formed, the first dies 150 can be stacked on the second die 160 in a face-to-face manner in step S108 as shown in FIG. 7D. That is, the RDLs 158 of the first dies 150 can be coupled to the RDL 166 of the second die 160 through the bonding layers B1 and B2. In some embodiments, step S108 may include bonding the bonding layers B1 of first dies 150 with the bonding layer B2 of the second die 160 by hybrid bonding.

Figure 7E:
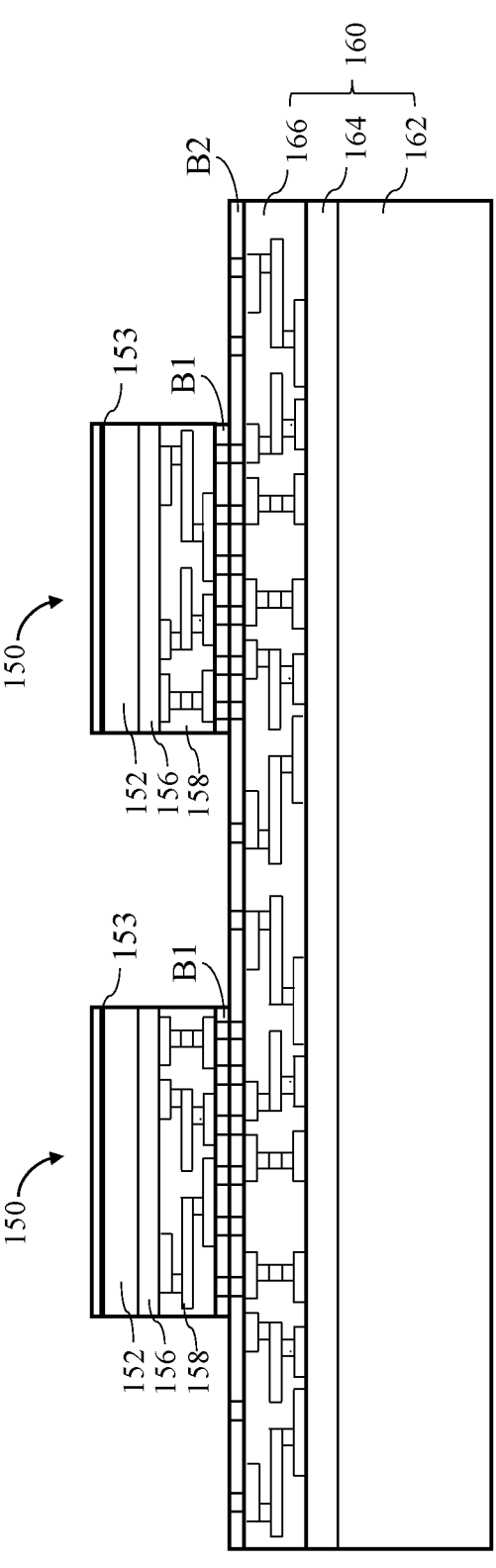

After the first dies 150 are stacked on the second die 160, a grinding process may be performed to planarize substrates 152 of the first dies 150 in step S110 as shown in FIG. 7E. That is, the substrates 152 of the first dies 150 can be thinned. In some embodiments, the substrate 152 may originally have a thickness of 100 to 770 μm, however, after step S110, the substrate 152 may be thinned to a thickness of 20 μm.

Figure 7F:
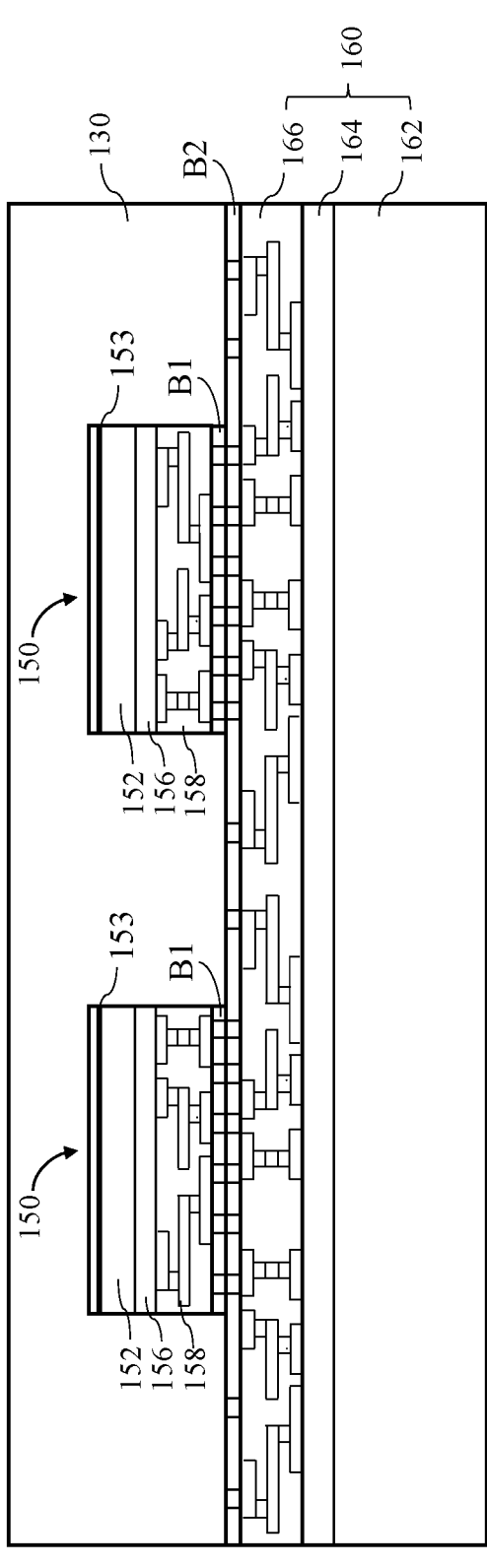
Figure 7G:
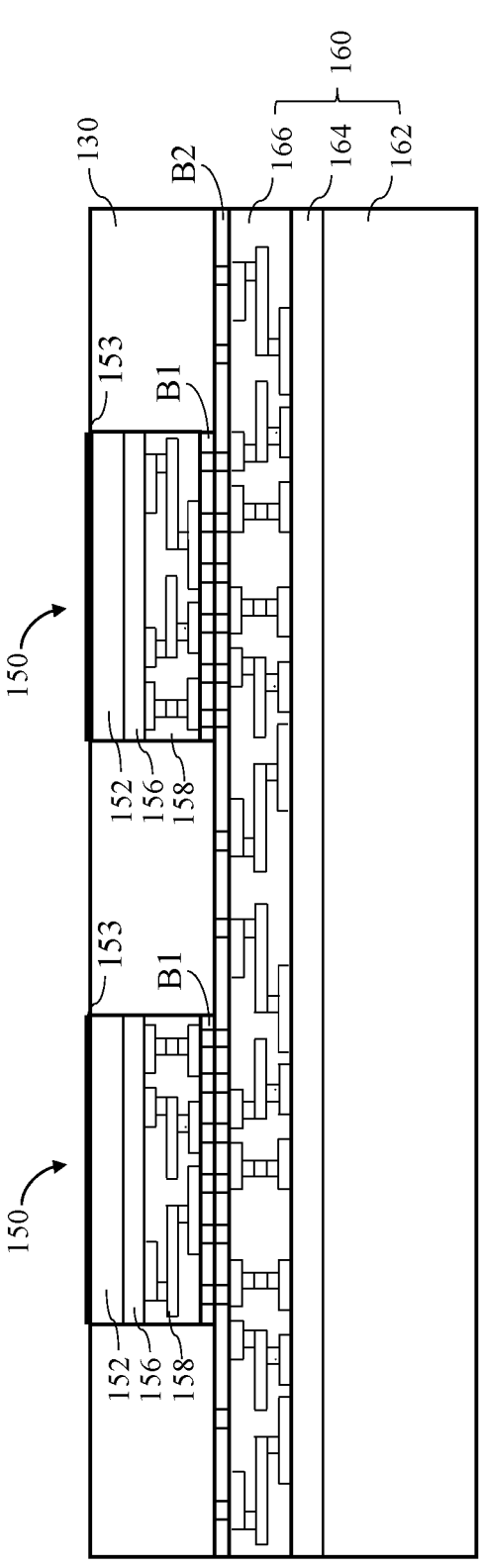

In step S112, a dielectric layer 130 can be formed on the second die 160 to cover the first dies 150 as shown in FIG. 7F. In some embodiments, the dielectric layer 130 can be, for example but not limited thereto, silicon oxynitride or other types of inorganic insulating material.

In step S114, a part of the dielectric layer 130 can be removed so as to expose the first substrates 152 of the first dies 150. In the present embodiment, the first dies 150 may further include stop layers 153 formed in the substrates 152 as shown in FIGS. 7A, 7D, 7E, 7F, and 7G. In such case, step S114 can be performed by grinding and etching the dielectric layer 130 to expose the stop layers 153 of the first dies 150 without removing the stop layers 153.

Figure 7H:
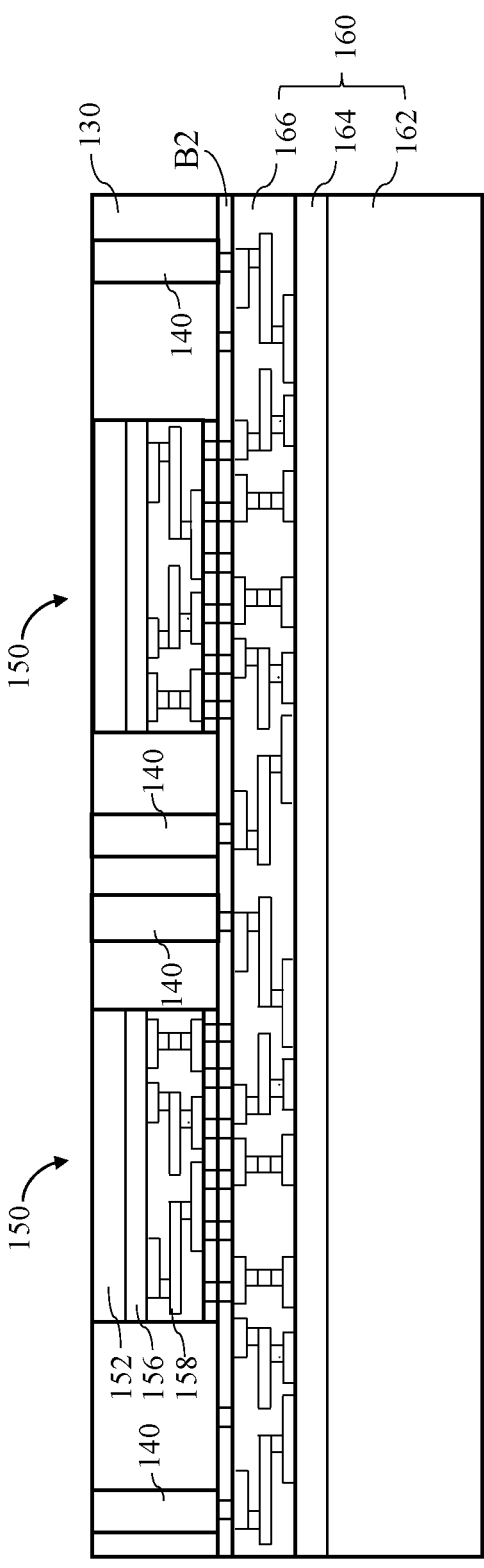
Figure 8:
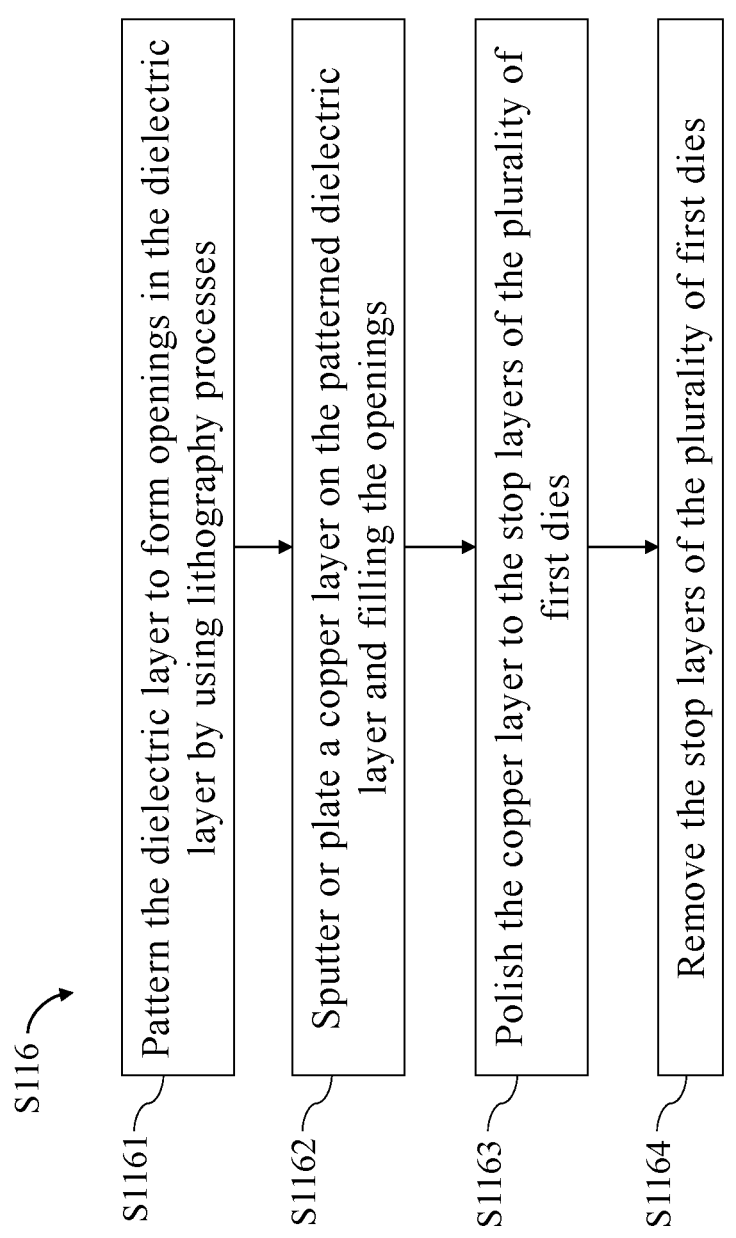
FIG. 8 shows sub-steps of a step in FIG. 6 according to one embodiment of the present disclosure.

Next, in step S116, TDVs 140 can be formed in the dielectric layer 130 as shown in FIG. 7H. FIG. 8 shows sub-steps of step S116 according to one embodiment of the present disclosure, and FIGS. 9A to 9D are schematic, cross-sectional diagrams showing a manufacturing process according to the sub-steps S1161 to S1164 of step S116.

Figure 9A:
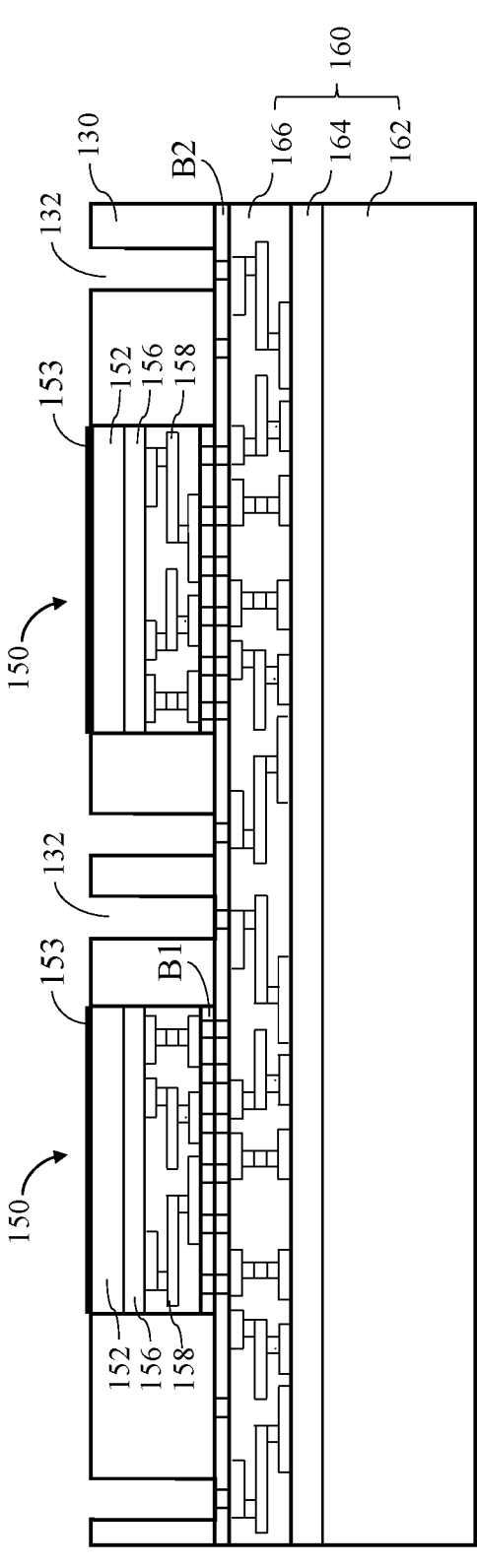
FIGS. 9A to 9D are schematic, cross-sectional diagrams showing the manufacturing process according to the sub-steps in FIG. 8.
Figure 9B:
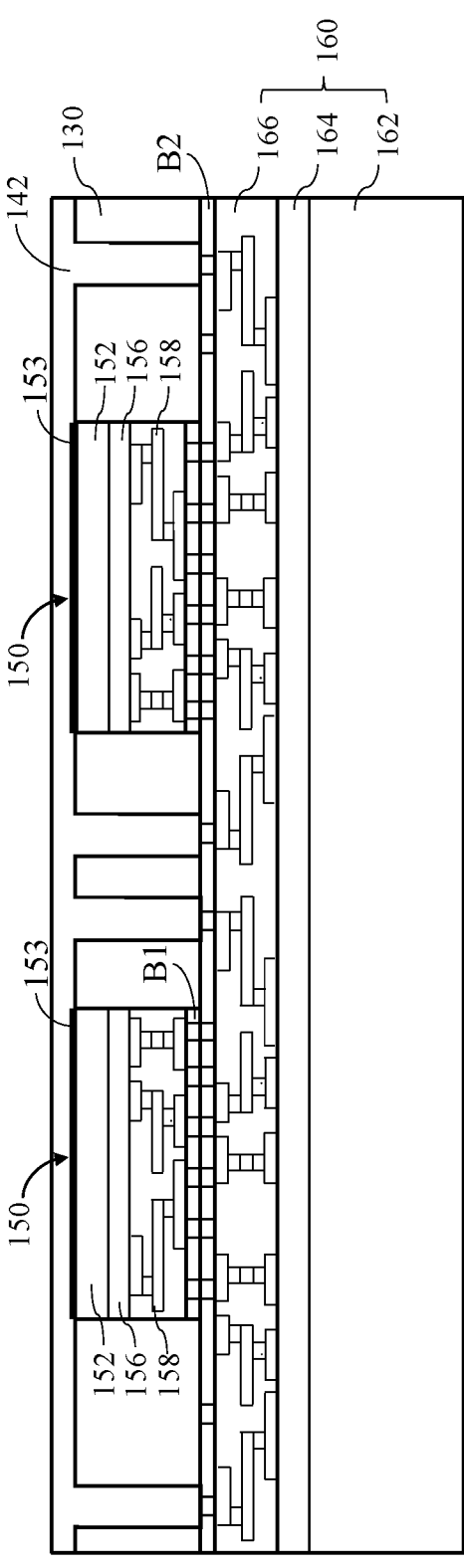

In sub-step S1161, openings 132 in the dielectric layer 130 can be formed as shown in FIG. 9A. In the present embodiment, the dielectric layer 130 can be patterned using lithography processes. Next, in sub-step S1162, a copper layer 142 can be sputtered or plated on the patterned dielectric layer 130 to fill the openings 132 as shown in FIG. 9B.

Figure 9C:
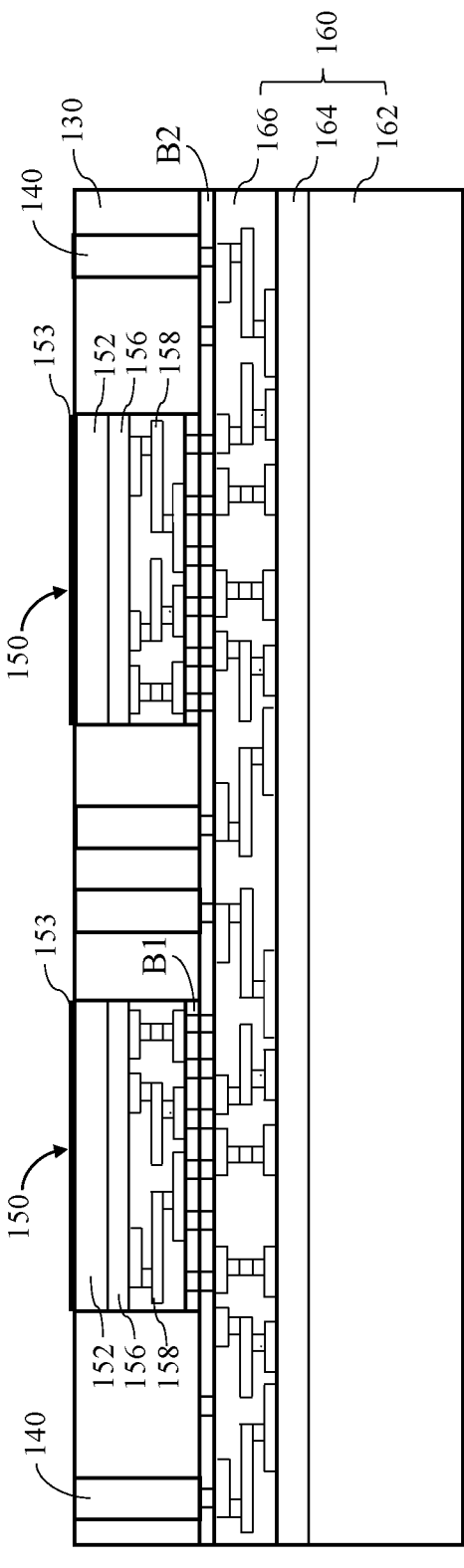
Figure 9D:
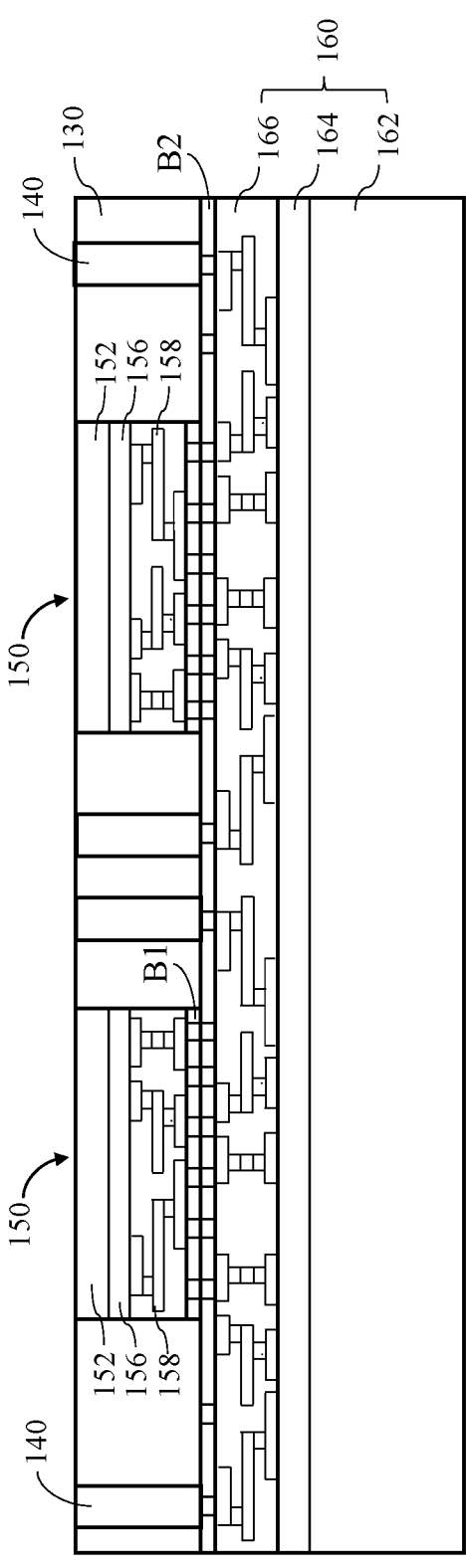

In sub-step S1163, the copper layer 142 is polished to the stop layers 153 of the first dies 150, and the TDVs 140 can be formed as shown in FIG. 9C. In addition, in sub-step S1164, the stop layers 153 can be removed as shown in FIG. 9D.

Figure 7I:
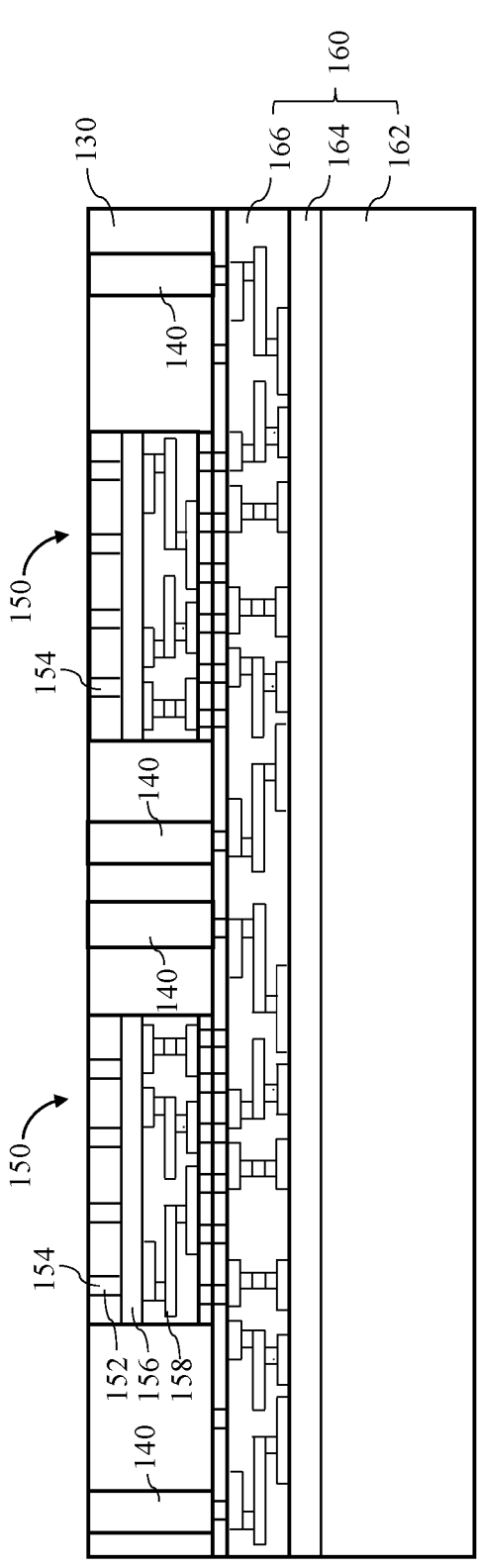

After the TDVs 140 are formed, TSVs 154 can be formed in the substrate 152 in step S118 as shown in FIG. 7I. In the present embodiment, since the substrate 152 of the first die 150 has been thinned in steps S110 and S114, the TSVs 154 can be formed with smaller pitches and depths. In some embodiments, the TSVs 154 can be tiny TSVs that have widths less than 100 nm and depths less than 500 nm.

Figure 7J:
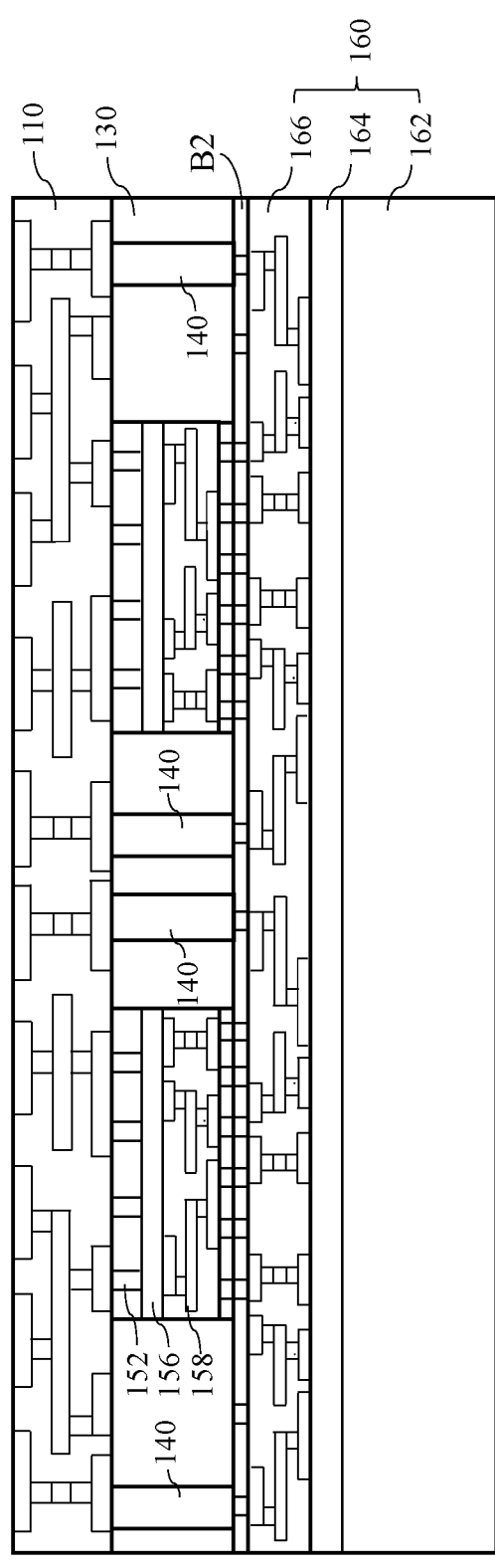

In step S120, a backside RDL 110 can be formed on the dielectric layer 130 and the first dies 150. As shown in FIG. 7J, the backside RDL 110 can be coupled to the TDVs 140 and the TSVs 154 by a second surface of the backside RDL 110.

Figure 7K:
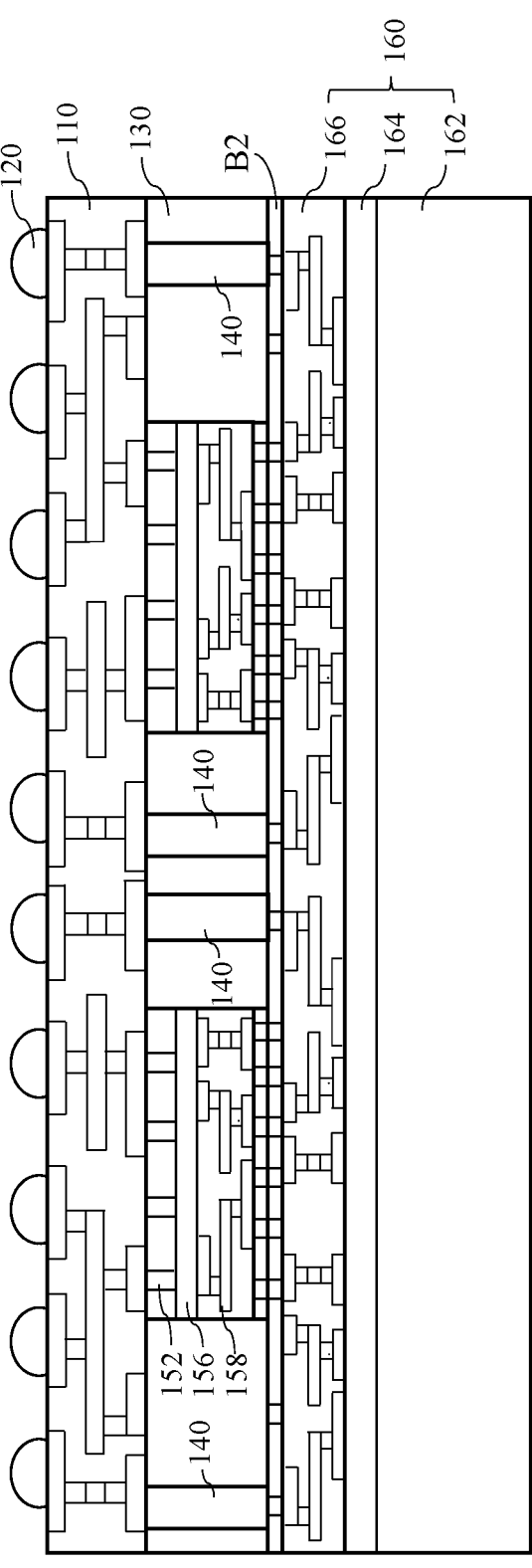

After the backside RDL 110 is formed, bumps 120 can be formed on a first surface of the backside RDL 110 in step S122 as shown in FIG. 7K.

In the present embodiment, steps S104 to S122 can be performed during a wafer process of the second die 160; therefore, after the semiconductor structure 100 is formed on the wafer, the method M1 may further include placing the wafer, in which the second die 160 is formed, on a dicing tape so as to frame the second die 160. In such case, the second die 160 can be diced from the wafer along with the first dies 150, the backside RDL, and the bumps 120. Thus, the semiconductor structure 100 can be obtained.

In the method M1, the first dies 150 can be stacked on the second die 160 before the TDVs 140 are formed; however, the present disclosure is not limited thereto. In some other embodiments, the TDVs 140 can be formed before the first dies 150 are stacked on the second die 160. In such case, the step for patterning the dielectric layer 130 may be skipped, thereby simplifying the manufacturing process of the semiconductor structure 100.

Figure 10:
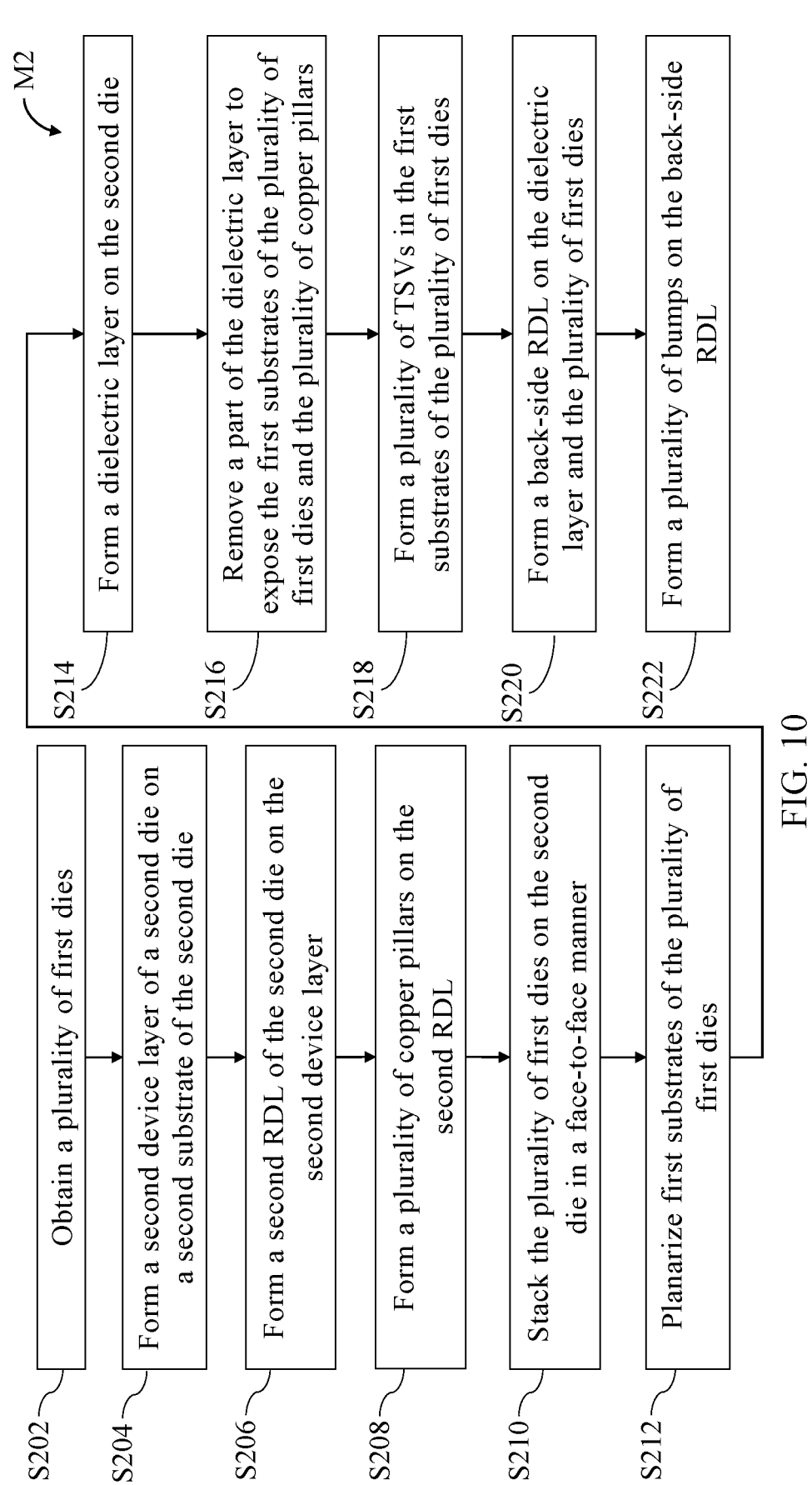
FIG. 10 shows a flowchart of a method for manufacturing a semiconductor structure according to another embodiment of the present disclosure.

FIG. 10 shows a flowchart of a method M2 for manufacturing the semiconductor structure 100 of FIG. 1 according to a second embodiment of the present disclosure. The method M2 includes steps S202 to S222, and can be adopted to manufacture the semiconductor structure 100. FIGS. 11A to 11K are schematic, cross-sectional diagrams showing a manufacturing process according to steps S202 to S222 of the method M2.

Figure 11B:
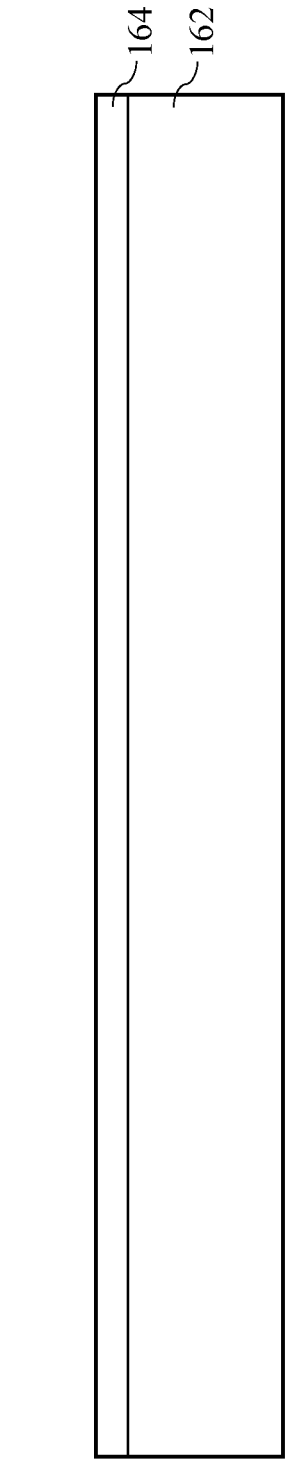
Figure 11C:
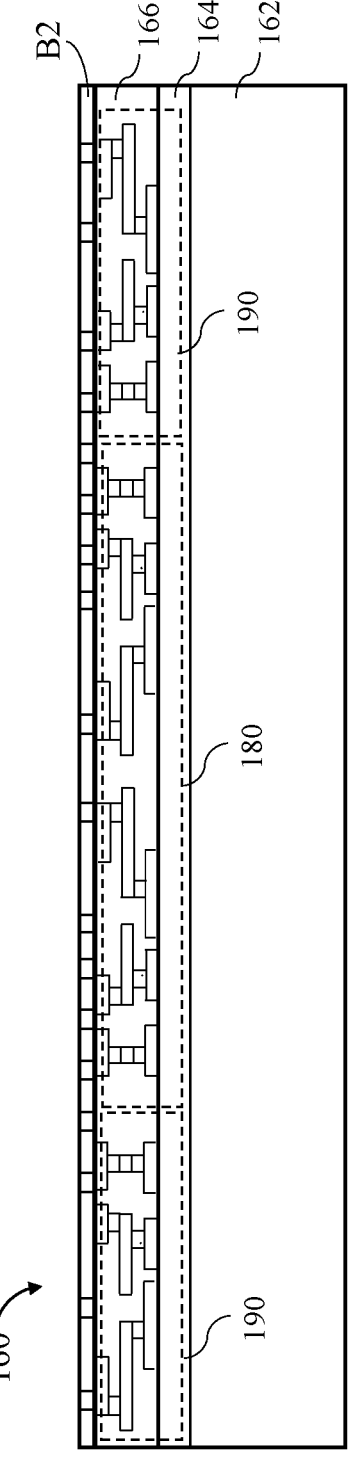
Figure 11D:
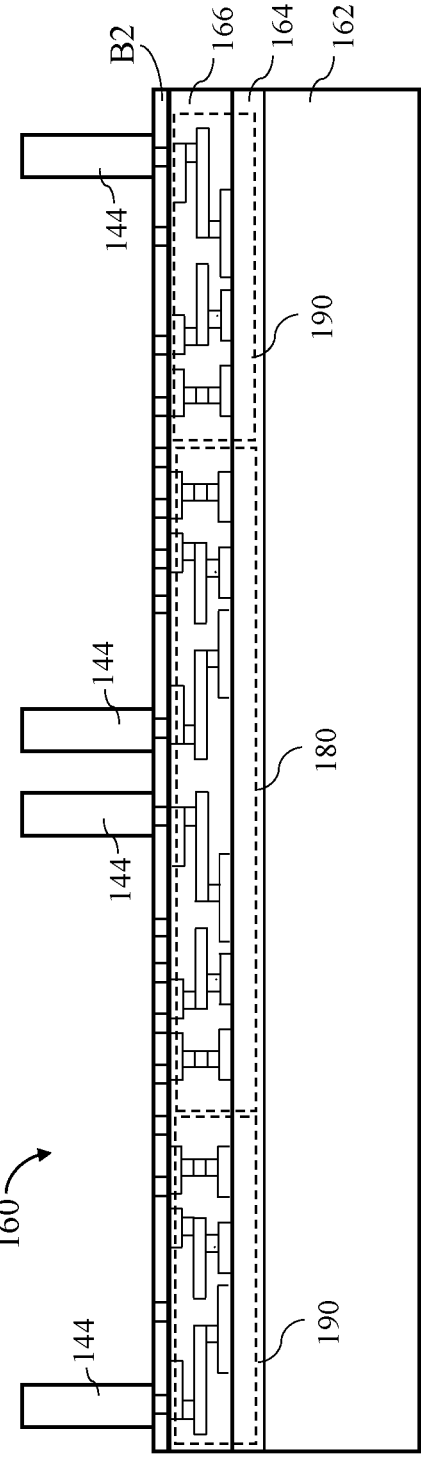
Figure 11E:
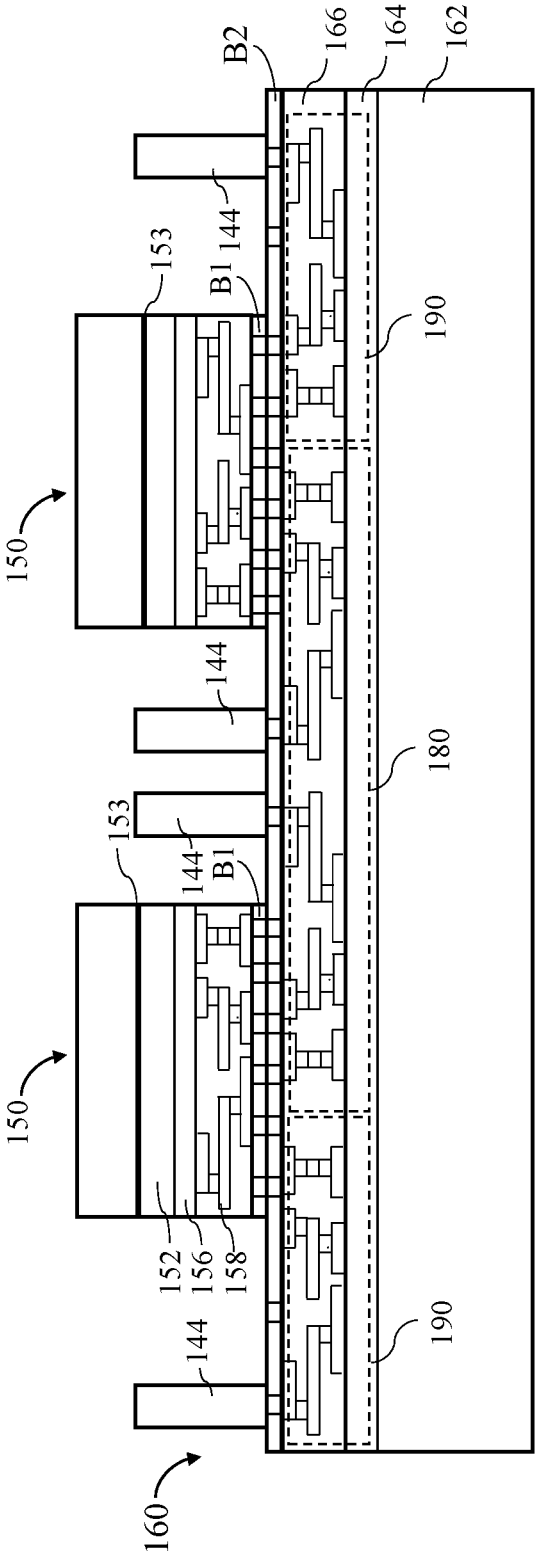

In the present embodiment, steps S202 to S206 are same as steps S102 to S106, and are shown in FIGS. 11A to 11C. However, after the RDL 166 is formed, in the method M2, copper pillars 144 that will be adopted as the TDVs 140 can be formed on the RDL 166 in step S208 as shown in FIG. 11D. In such case, the first dies 150 can be stacked on the second die 160 in a face-to-face manner in step S210 after the copper pillars 144 are formed, as shown in FIG. 11E. In the present embodiment, the RDLs 158 of the first dies 150 can be coupled to the RDL 166 of the second die 160 through the bonding layers B1 and B2. In some embodiments, step S208 may include bonding the bonding layers B1 of first dies 150 with the bonding layer B2 of the second die 160 by hybrid bonding.

Figure 11F:
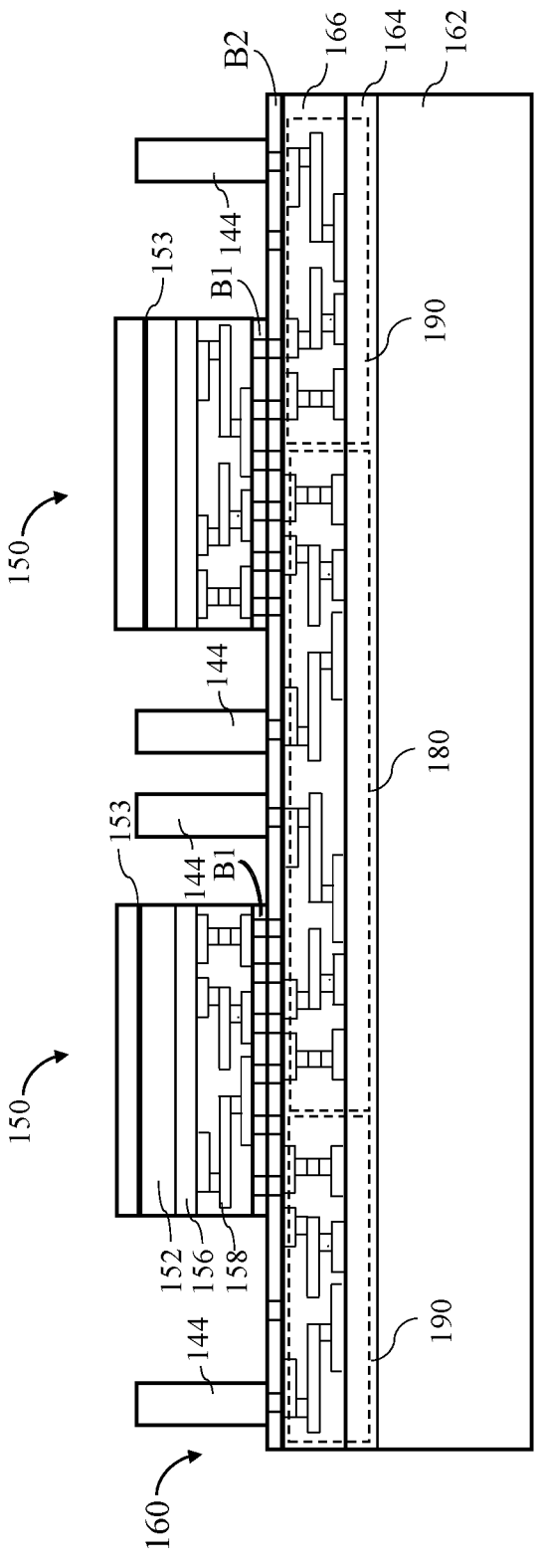

After the first dies 150 are stacked on the second die 160, a grinding process may be performed to planarize the substrates 152 of the first dies 150 in step S212 as shown in FIG. 11F. That is, the substrates 152 of the first dies 150 can be thinned.

Figure 11G:
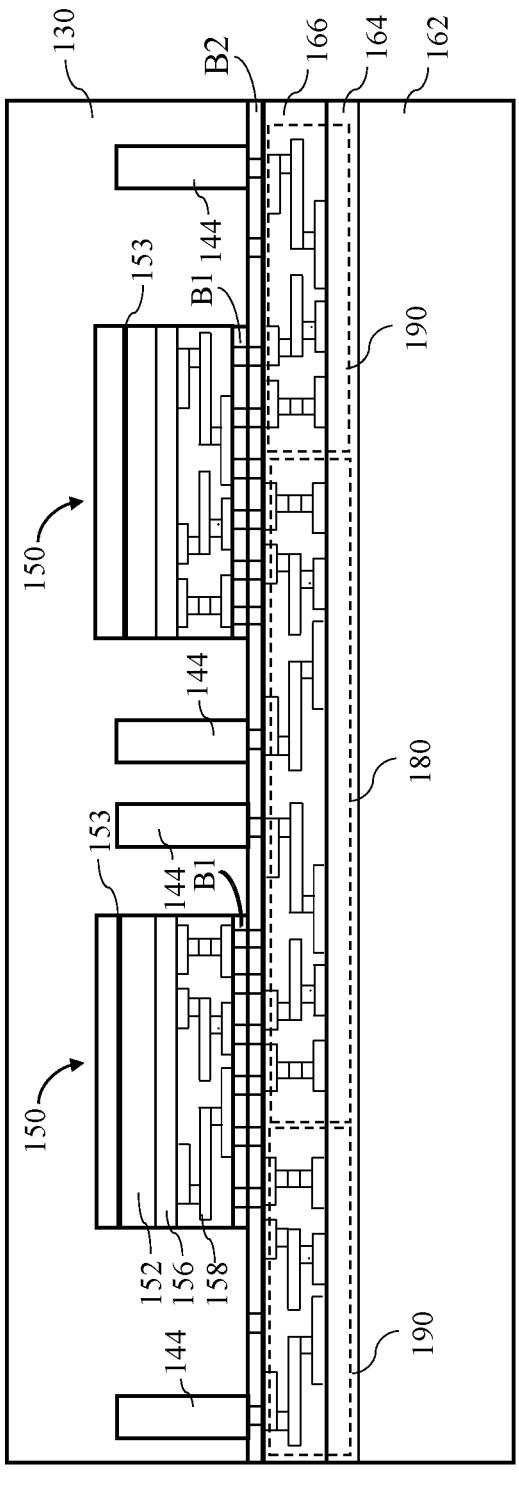
Figure 11H:
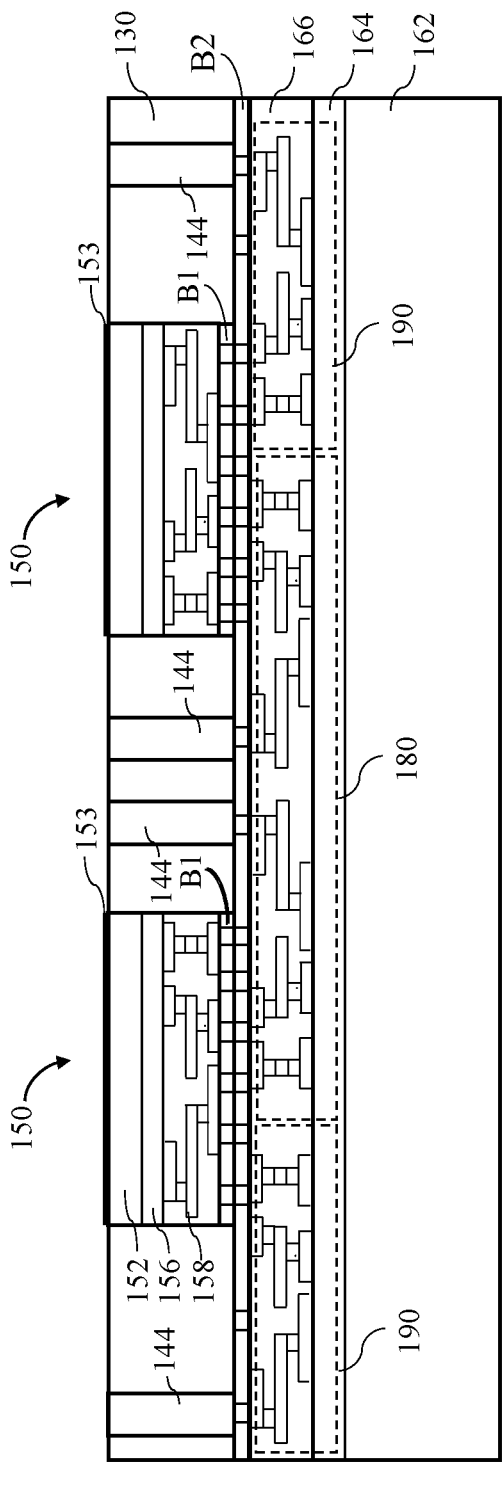

In step S214, the dielectric layer 130 can be formed on the second die 160 to cover the first dies 150 and the copper pillars 144 as shown in FIG. 11G. After the dielectric layer 130 is formed, a part of the dielectric layer 130 can be removed so as to expose the copper pillars 144 and the first substrates 152 of the first dies 150 in step S216 as shown in FIG. 11H. As a result, the copper pillars 144 are surrounded by the dielectric layer 130, thereby forming the TDVs 140.

Figure 11I:
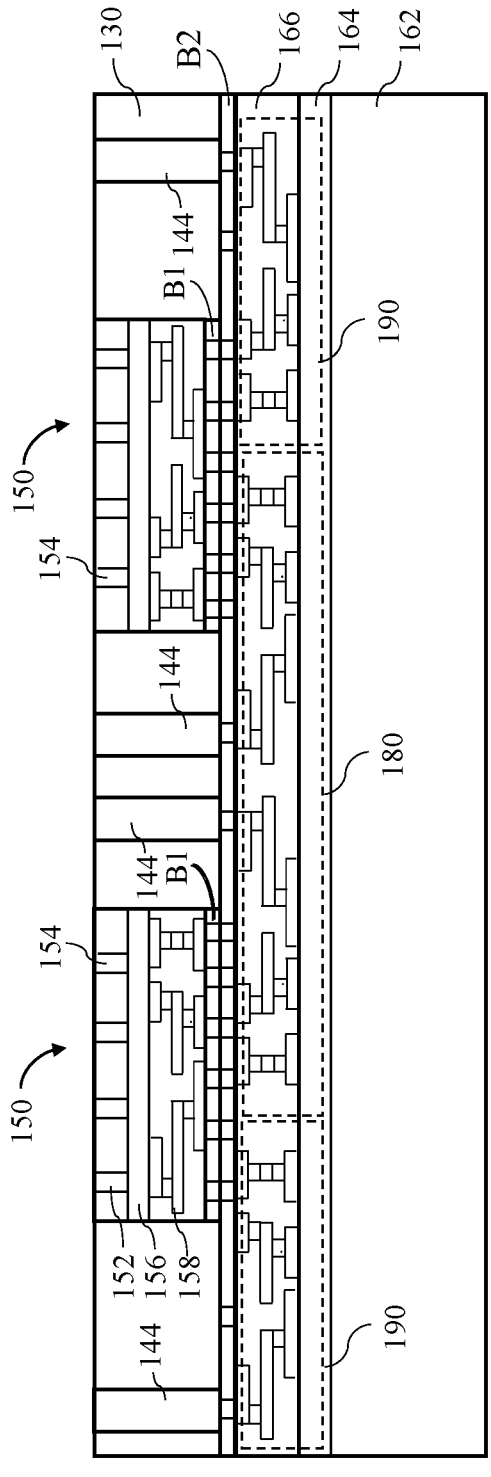

In the present embodiment, the first dies 150 may further include stop layers 153 formed in the substrates 152. In such case, the step S216 may include two grinding and etching processes. The first grinding and etching process can be stopped when reaching the stop layers 153, and the second grinding and etching (or planarization) process, such as a chemical-mechanical polishing (CMP) process, may be performed to make the substrate 152 even thinner and remove the stop layers 153. After the stop layers 153 are removed, the TSVs 154 can be formed in step S218 as shown in FIG. 11I.

Figure 11J:
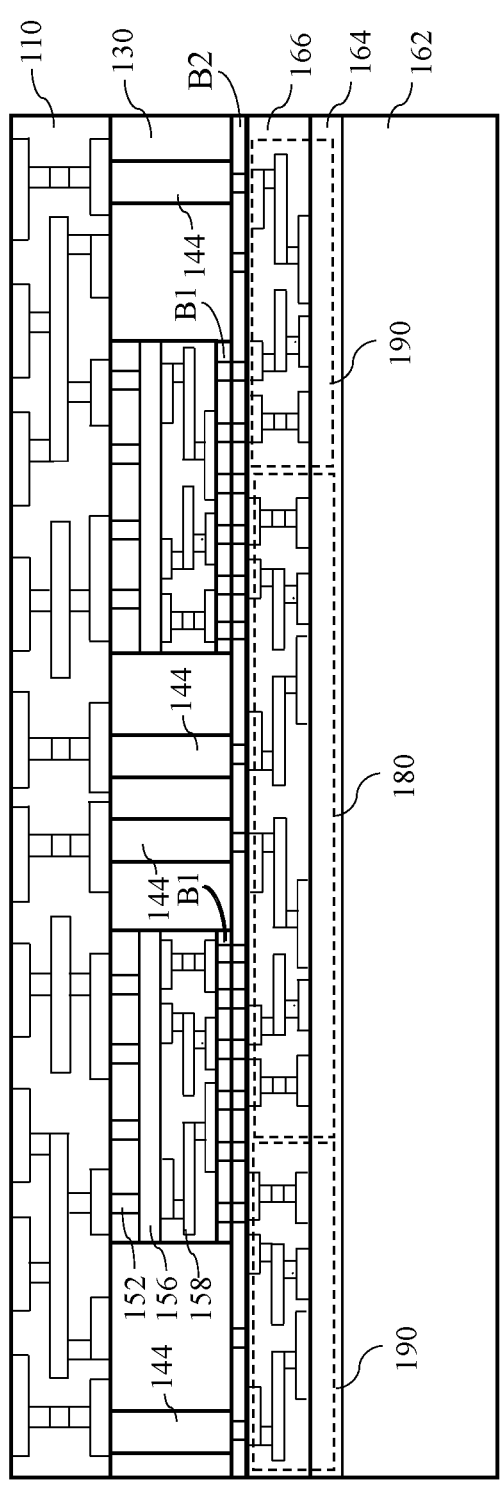
Figure 11K:
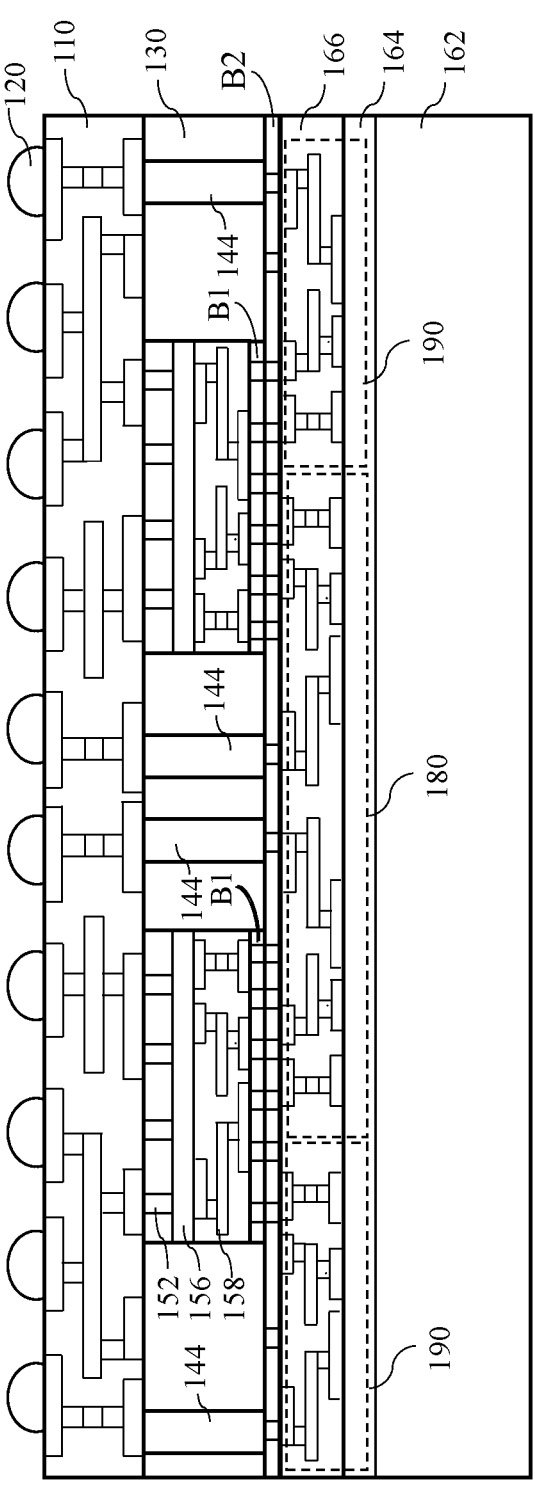

In step S220, the backside RDL 110 can be formed on the dielectric layer 130 and the first dies 150 as shown in FIG. 11J, and in step S222, bumps 120 can be formed on the backside RDL 110 as shown in FIG. 11K. Finally, the method M2 can further include placing the second die 160 on a dicing tape so as to frame the second die 160. In such case, the second die 160 can be diced from the wafer along with the first dies 150, the backside RDL, and the bumps 120. Thus, the semiconductor structure 100 can be obtained.

In summary, the semiconductor structure and methods for manufacturing the semiconductor structures provided by the embodiments of present disclosure allow backside power delivery in die-stacking structures. Since the bottom dies, that is, the first dies on which the second die is stacked, can receive power supplies from the tiny TSVs formed in the backside substrates, more space can be provided for trace routing between the stacked dies. As a result, greater computation capability can be achieved within a smaller chip area with less power loss.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure comprising:
   a backside redistribution layer (RDL);
   a plurality of bumps disposed on a first surface of the backside RDL;
   a dielectric layer disposed on a second surface of the backside RDL;
   a plurality of through dielectric vias (TDVs) passing through the dielectric layer;
   a plurality of first dies disposed within the dielectric layer, wherein each of the first dies comprises:
      a first substrate disposed on the backside RDL;
      a plurality of through silicon vias (TSVs) passing through the first substrate and contacting conductive paths in the backside RDL;
      a first device layer disposed on the first substrate;
      a first RDL disposed on the first device layer;
      a computation circuit formed in the first device layer and the first RDL; and
   a second die stacked on the plurality of first dies in a face-to-face manner, wherein the second die comprises:
      a second substrate;
      a second device layer disposed on the second substrate;
      a second RDL disposed on the second device layer, wherein the second RDL is coupled to the first RDL and the plurality of TDVs; and
      a memory circuit formed in the second device layer and the second RDL;
   wherein:
   each of the computation circuit is configured to transmit signals to the memory circuit through the first RDL and the second RDL;
   each of the plurality of first dies is configured to receive a first supply voltage through at least one first bump of the plurality of bumps, at least one first conductive path in the backside RDL, and at least one TSV of the plurality of TSVs; and
   the second die is configured to receive a second supply voltage through at least one second bump of the plurality of bumps, at least one second conductive path in the backside RDL, and at least one TDV of the plurality of TDVs.

2. The semiconductor structure of claim 1, wherein an input/output circuit is further formed in the second device layer and the second RDL.

3. The semiconductor structure of claim 2, wherein the computation circuit is configured to transmit signals to the input/output circuit through the first RDL and the second RDL, and the input/output circuit is configured to transmit signals to an external circuit through at least one bump of the plurality of bumps and at least one TDV of the plurality of TDVs.

4. The semiconductor structure of claim 1, wherein the memory circuit comprises a static random-access memory (SRAM), a resistive random-access memory (RRAM), or a magnetoresistive random-access memory (MRAM).

5. The semiconductor structure of claim 1, wherein the second die comprises a plurality of input/output circuits, and each of the plurality of first dies comprises a computation circuit coupled to an input/output circuit of the plurality of input/output circuits.

6. The semiconductor structure of claim 1, wherein the first substrate is thinner than the second substrate.

7. The semiconductor structure of claim 1, wherein a die size of the second die is greater than a die size of each of the plurality of first dies.

8. A semiconductor chiplet comprising:

an interposer;

the semiconductor structure of claim 1 disposed on the interposer; and a plurality of high bandwidth memories (HBM) disposed on the interposer.

9. A semiconductor structure comprising:

a backside redistribution layer (RDL);

a plurality of bumps disposed on a first surface of the backside RDL;

a dielectric layer disposed on a second surface of the backside RDL;

a plurality of through dielectric vias (TDVs) passing through the dielectric layer;

a plurality of first dies disposed within the dielectric layer, wherein each of the first dies comprises:

a first substrate disposed on the backside RDL;

a plurality of through silicon vias (TSVs) passing through the first substrate and contacting conductive paths in the backside RDL;

a first device layer disposed on the first substrate;

a first RDL disposed on the first device layer;

a computation circuit formed in the first device layer and the first RDL; and a second die stacked on the plurality of first dies in a face-to-face manner, wherein the second die comprises:

a second substrate;

a second device layer disposed on the second substrate;

a second RDL disposed on the second device layer, wherein the second RDL is coupled to the first RDL and the plurality of TDVs; and a memory circuit formed in the second device layer and the second RDL;

wherein:

each of the computation circuit is configured to transmit signals to the memory circuit through the first RDL and the second RDL; and power supply lines for providing power supply to the plurality of first dies and the second die are disposed in regions other than a region between the plurality of first dies and the second die where the plurality of first dies and the second die overlap when viewed from top.

10. The semiconductor structure of claim 9, wherein:

each of the plurality of first dies is configured to receive a first supply voltage through at least one first bump of the plurality of bumps, at least one first conductive path in the backside RDL, and at least one TSV of the plurality of TSVs; and the second die is configured to receive a second supply voltage through at least one second bump of the plurality of bumps, at least one second conductive path in the backside RDL, and at least one TDV of the plurality of TDVs.

11. The semiconductor structure of claim 9, wherein an input/output circuit is further formed in the second device layer and the second RDL.

12. The semiconductor structure of claim 11, wherein the computation circuit is configured to transmit signals to the input/output circuit through the first RDL and the second RDL, and the input/output circuit is configured to transmit signals to an external circuit through at least one bump of the plurality of bumps and at least one TDV of the plurality of TDVs.

13. The semiconductor structure of claim 9, wherein the memory circuit comprises a static random-access memory (SRAM), a resistive random-access memory (RRAM), or a magnetoresistive random-access memory (MRAM).

14. The semiconductor structure of claim 9, wherein the second die comprises a plurality of input/output circuits, and each of the plurality of first dies comprises a computation circuit coupled to an input/output circuit of the plurality of input/output circuits.

15. The semiconductor structure of claim 9, wherein the first substrate is thinner than the second substrate.

16. The semiconductor structure of claim 9, wherein a die size of the second die is greater than a die size of each of the plurality of first dies.

* * * * *